(12) United States Patent
Huang

(10) Patent No.: US 11,469,235 B2
(45) Date of Patent: Oct. 11, 2022

(54) SEMICONDUCTOR DEVICE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 28 days.

(21) Appl. No.: 16/585,598

(22) Filed: Sep. 27, 2019

(65) Prior Publication Data

US 2021/0098464 A1    Apr. 1, 2021

(51) Int. Cl.
*H01L 27/108* (2006.01)
*H01L 23/535* (2006.01)

(52) U.S. Cl.
CPC ...... *H01L 27/10888* (2013.01); *H01L 23/535* (2013.01)

(58) Field of Classification Search
CPC ............ H01L 27/10888; H01L 23/535; H01L 21/764
See application file for complete search history.

(56) References Cited

U.S. PATENT DOCUMENTS

| 2012/0276711 | A1  | 11/2012 | Yoon et al. |
| 2013/0093048 | A1* | 4/2013  | Chang ............... H04L 27/10808 257/532 |
| 2015/0014759 | A1* | 1/2015  | Lee .................. H01L 23/53266 257/306 |
| 2016/0148937 | A1  | 5/2016  | Park et al. |
| 2016/0329337 | A1  | 11/2016 | Hwang et al. |

* cited by examiner

*Primary Examiner* — Jasmine J Clark
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a dielectric structure disposed over the substrate; a bit line bottom contact disposed in the dielectric structure; a composite decoupling structure disposed between the dielectric structure and the bit line bottom contact, wherein the composite decoupling structure comprises an air gap and a dielectric spacer; a bit line top contact disposed over the bit line bottom contact; and a bit line to disposed over the bit line top contact.

15 Claims, 34 Drawing Sheets

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with air gaps and a method for fabricating the semiconductor device with air gaps.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a dielectric structure disposed over the substrate; a bit line bottom contact disposed in the dielectric structure; a composite decoupling structure disposed between the dielectric structure and the bit line bottom contact, wherein the composite decoupling structure comprises an air gap and a dielectric spacer; a bit line top contact disposed over the bit line bottom contact; and a bit line disposed over the bit line top contact.

Another aspect of the present disclosure provides a method for fabricating a semiconductor device including: forming a dielectric structure over a substrate; forming a bit line bottom contact in the dielectric structure; forming a composite decoupling structure between the dielectric structure and the bit line bottom contact, wherein the composite decoupling structure comprises an air gap and a dielectric spacer; forming a bit line top contact over the bit line bottom contact; and forming a bit line over the bit line top contact.

In some embodiments, the semiconductor device further comprises a liner disposed between the bit line bottom contact and the second air gaps.

In some embodiments, a width of a bottom of the bit line top contact is less than a width of a top surface of the bit line bottom contact.

In some embodiments, the bit line is asymmetrically disposed over the bit line top contact.

In some embodiments, a width of a top surface of the bit line top contact is greater than a width of a bottom of the bit line top contact.

In some embodiments, a width of the bit line is greater than a top surface of the bit line top contact In some embodiments, the air gap is disposed between the dielectric spacer and the dielectric structure.

In some embodiments, the air gap has a spacer profile.

In some embodiments, the semiconductor device further comprises a barrier layer disposed between the bit line top contact and the bit line bottom contact.

In some embodiments, the semiconductor device further comprises a capacitor contact adjacent to the bit line bottom contact, wherein the capacitor contact comprises a doped polysilicon layer, a cobalt silicide layer disposed over the doped polysilicon layer, and a tungsten contact disposed over the cobalt silicide layer.

Due to the design of the semiconductor device having a composite decoupling structure having the air gap, the parasitic capacitance of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
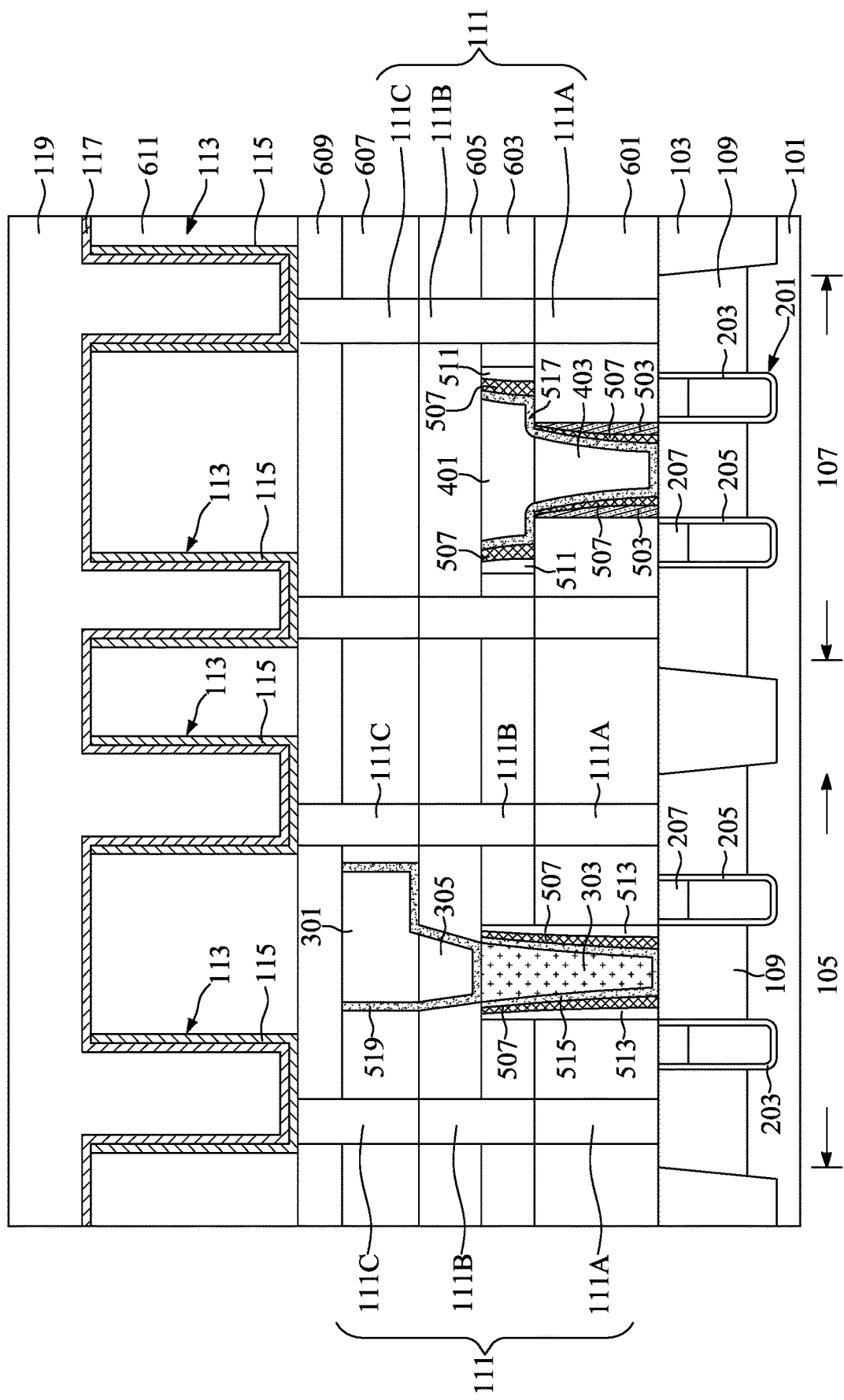
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Note that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device in accordance with one embodiment of the present disclosure.

With reference to FIG. 1, in the embodiment depicted, a semiconductor device may include a substrate 101, an isolation layer 103, a plurality of doped regions 109, a plurality of conductive plugs 111, a plurality of capacitor structures 113, a plurality of word lines 201, a high-level bit line 301, a high-level bit line bottom contact 303, a high-level bit line top contact 305, a low-level bit line 401, a low-level bit line bottom contact 403, a plurality of first spacers 503, a plurality of second spacers 507, a plurality of air gaps, and a plurality of insulating films.

With reference to FIG. 1, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a crystal orientation <100>. Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

With reference to FIG. 1, in the embodiment depicted, the isolation layer 103 may be disposed in the substrate 101. (Three isolation layers 103 are shown in the cross-sectional diagram of FIG. 1, but other quantities of isolation layers may be used in other embodiments.) The isolation layer 103 may be formed of, for example, an insulating material such as silicon oxide, silicon nitride, silicon oxynitride, silicon nitride oxide, or fluoride-doped silicate. The isolation layer 103 may define a plurality of active areas of the substrate 101. The plurality of active areas may include a first active area 105 and a second active area 107. The first active area 105 and the second active area 107 may be adjacent to each other.

Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, in the embodiment depicted, the plurality of doped regions 109 may be disposed in an upper portion of the first active area 105 of the substrate 101 and in an upper portion of the second active area 107 of the substrate 101. The plurality of doped regions 109 may be doped with a dopant such as phosphorus, arsenic, or antimony.

With reference to FIG. 1, in the embodiment depicted, the plurality of word lines 201 may be disposed in the upper portion of the first active area 105 and in the upper portion of the second active area 107. The first active area 105 and the second active area 107 may respectively intersect two of the plurality of word lines 201. Two sides of each of the plurality of word lines 201 may be adjacent to the plurality of doped regions 109. The plurality of word lines 201 may include a plurality of word line insulating layers 203, a plurality of word line electrodes 205, and a plurality of word line first capping layers 207.

With reference to FIG. 1, in the embodiment depicted, the plurality of word line insulating layers 203 may be respectively correspondingly inwardly disposed in the first active area 105 and the second active area 107. Bottoms of the plurality of word line insulating layers 203 may be flat. The bottoms of the plurality of word line insulating layers 203 may be at a vertical level about 0.1 nm to about 50 nm lower than a vertical level of bottoms of the plurality of doped regions 109. A thickness of the plurality of word line insulating layers 203 may be about 0.5 nm to about 10 nm. The plurality of word line insulating layers 203 may be formed of an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like.

With reference to FIG. 1, in the embodiment depicted, the plurality of word line electrodes 205 may be respectively correspondingly disposed on the plurality of word line insulating layers 203. Top surfaces of the plurality of word line electrodes 205 may be at a vertical level higher than the vertical level of the bottoms of the plurality of doped regions 109. Alternatively, in another embodiment, the vertical level of the top surfaces of the plurality of word line electrodes 205 may be at about the same vertical level as the bottoms of the plurality of doped regions 109. The plurality of word line electrodes 205 may be formed of a conductive material such as polysilicon, silicon germanium, metal, metal alloy, metal silicide, metal nitride, metal carbide, or a combination including multilayers thereof. When multilayers are present, a diffusion barrier layer (not shown) such as titanium nitride or tantalum nitride may be disposed between each of the multilayers. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. Thicknesses of the plurality of word line electrodes 205 may be between about 50 nm and about 500 nm.

With reference to FIG. 1, in the embodiment depicted, the plurality of word line first capping layers 207 may be respectively correspondingly disposed on the plurality of word line electrodes 205. Sidewalls of the plurality of word line first capping layers 207 may respectively correspondingly contact inner surfaces of the plurality of word line insulating layers 203. Top surfaces of the plurality of word line first capping layers 207 may be even with a top surface of the substrate 101. The plurality of word line first capping layers 207 may be formed of an insulating material having a dielectric constant of about 4.0 or greater.

With reference to FIG. 1, in the embodiment depicted, a plurality of insulating films may be disposed on the substrate 101. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. The plurality of insulating films may be stacked films including, from bottom to top, a first insulating film 601, a second insulating film 603, a third insulating film 605, a fourth insulating film 607, a fifth insulating film 609, and a sixth insulating film 611.

With reference to FIG. 1, in the embodiment depicted, a high-level bit line bottom contact 303 may be disposed above the first active area 105 and between an adjacent pair of the plurality of word lines 201 in the first active area 105. The high-level bit line bottom contact 303 may be disposed in both the first insulating film 601 and the second insulating film 603 and may be electrically coupled to one of the plurality of doped regions 109 disposed between the adjacent pair of the plurality of word lines 201 in the first active area 105. The high-level bit line bottom contact 303 may be formed of a conductive material such as doped polysilicon, metal, metal nitride, or metal silicide. Specifically, in the embodiment depicted, the high-level bit line bottom contact 303 is formed of tungsten.

With reference to FIG. 1, in the embodiment depicted, the high-level bit line top contact 305 may be disposed above the high-level bit line bottom contact 303 and electrically coupled to the high-level bit line bottom contact 303. The high-level bit line top contact 305 may be disposed in the third insulating film 605. A width of a bottom of the high-level bit line top contact 305 may be less than a width of a top surface of the high-level bit line top contact 305; in other words, a profile of the high-level bit line top contact 305 may be tapered from top to bottom. Thus, sidewalls of the high-level bit line top contact 305 may be slanted toward each other. The width of the bottom of the high-level bit line top contact 305 may be about the same as a width of a top surface of the high-level bit line bottom contact 303. Alternatively, in another embodiment, the width of the bottom of the high-level bit line top contact 305 may be less than the width of the top surface of the high-level bit line bottom contact 303. The high-level bit line top contact 305 may be formed of a conductive material such as doped polysilicon, metal, metal nitride, or metal silicide.

With reference to FIG. 1, in the embodiment depicted, the high-level bit line 301 may be disposed in the fourth insulating film 607. The high-level bit line 301 may be asymmetrically disposed on the high-level bit line top contact 305. For example, only a left portion of a bottom of the high-level bit line 301 may be disposed on the high-level bit line top contact 305. The high-level bit line 301 asymmetrically disposed on the high-level bit line top contact 305 may further keep the high-level bit line 301 away from semiconductor elements disposed at the left side of the high-level bit line 301; therefore, the interference resulting from the high-level bit line 301 to those semiconductor elements may be reduced. The high-level bit line 301 may be formed of a conductive material such as tungsten, aluminum, copper, nickel, or cobalt.

With reference to FIG. 1, in the embodiment depicted, the low-level bit line bottom contact 403 may be disposed above the second active area 107 and between an adjacent pair of the plurality of word lines 201 in the second active area 107. The low-level bit line bottom contact 403 may be disposed in the first insulating film 601 and may be electrically coupled to one of the plurality of doped regions 109 disposed between the adjacent pair of the plurality of word lines 201 in the second active area 107. The low-level bit line bottom contact 403 may be formed of a conductive material such as doped polysilicon, metal, metal nitride, or metal silicide.

With reference to FIG. 1, in the embodiment depicted, the low-level bit line 401 may be disposed above the low-level bit line bottom contact 403 and electrically coupled to the low-level bit line bottom contact 403. The low-level bit line 401 may be disposed in the second insulating film 603. A top surface of the low-level bit line 401 may be even with the top surface of the high-level bit line bottom contact 303. The low-level bit line 401 may be disposed at a vertical level lower than a vertical level of the high-level bit line top contact 305 or a vertical level of the high-level bit line 301. The low-level bit line 401 may be formed of a conductive material such as doped polysilicon, metal, metal nitride, or metal silicide. The low-level bit line 401 may be formed of the same material as the material of the low-level bit line bottom contact 403, but is not limited thereto. Because the low-level bit line 401 is disposed at the vertical level lower than the vertical level of the high-level bit line 301, a distance between the low-level bit line 401 and the high-level bit line 301 may be extended. Thus, the parasitic capacitance between the low-level bit line 401 and the high-level bit line 301 may be reduced. That is to say, an interference effect between electrical signals induced or applied to the low-level bit line 401 and the high-level bit line 301 may be remarkably alleviated by the extended distance between the low-level bit line 401 and the high-level bit line 301.

With reference to FIG. 1, in the embodiment depicted, the plurality of second spacers 507 may be respectively correspondingly disposed adjacent to sidewalls of the high-level bit line bottom contact 303, sidewalls of the low-level bit line bottom contact 403, and sidewalls of the low-level bit line 401. The plurality of second spacers 507 may be formed of, for example, silicon oxide, silicon nitride, silicon oxynitride, or silicon nitride oxide. Specifically, in the embodiment depicted, the plurality of second spacers 507 are formed of silicon nitride.

With reference to FIG. 1, in the embodiment depicted, a first liner 515 may be disposed on and attached to the sidewalls of the high-level bit line bottom contact 303 and the bottom of the high-level bit line bottom contact 303. The first liner 515 attached to the sidewalls of the high-level bit line bottom contact 303 may be disposed between the high-level bit line bottom contact 303 and the plurality of second spacers 507 that are adjacent to the high-level bit line bottom contact 303. The first liner 515 attached to the bottom of the high-level bit line bottom contact 303 may be disposed between the one of the plurality of doped regions 109 disposed between the adjacent pair of the plurality of word lines 201 in the first active area 105 and the high-level bit line bottom contact 303. The first liner 515 may be formed of, for example, titanium, titanium nitride, titanium silicon nitride, tantalum, tantalum nitride, tantalum silicon nitride, or a combination thereof. The first liner 515 may improve adhesion between the high-level bit line bottom contact 303 and the plurality of second spacers 507 that are adjacent to the high-level bit line bottom contact 303.

With reference to FIG. 1, in the embodiment depicted, a second liner 517 may be disposed on and attached to the sidewalls of the low-level bit line 401, sidewalls of the low-level bit line bottom contact 403, a bottom of the low-level bit line bottom contact 403, and a portion of a top surface of the first insulating film 601. The second liner 517 attached to the sidewalls of the low-level bit line 401 may be disposed between the low-level bit line 401 and the plurality of second spacers 507 that are adjacent to the low-level bit line 401. The second liner 517 attached to the sidewalls of the low-level bit line bottom contact 403 may be disposed between the low-level bit line bottom contact 403 and the plurality of second spacers 507 that are adjacent to the low-level bit line bottom contact 403. The second liner 517 attached to the bottom of the low-level bit line bottom contact 403 may be disposed between the low-level bit line bottom contact 403 and the one of the plurality of doped regions 109 disposed between the adjacent pair of the plurality of word lines 201 in the second active area 107. The second liner 517 may be formed of the same material as the material of the first liner 515, but is not limited thereto. The second liner 517 may improve adhesion between the low-level bit line 401 and the plurality of second spacers 507 that are adjacent to the low-level bit line 401, and adhesion between the low-level bit line bottom contact 403 and the plurality of second spacers 507 adjacent to the low-level bit line bottom contact 403.

With reference to FIG. 1, in the embodiment depicted, a third liner 519 may be disposed on and attached to sidewalls of the high-level bit line 301, a portion of the bottom of the high-level bit line 301, the sidewalls of the high-level bit line top contact 305, and the bottom of the high-level bit line top contact 305. The third liner 519 may be formed of the same material as the material of the first liner 515, but is not limited thereto. The third liner 519 may improve adhesion between the high-level bit line 301 and the fourth insulating film 607, and adhesion between the high-level bit line top contact 305 and the third insulating film 605.

With reference to FIG. 1, in the embodiment depicted, the plurality of first spacers 503 may be disposed in the first insulating film 601 and adjacent to the sidewalls of the low-level bit line bottom contact 403. Specifically, the plurality of first spacers 503 may be respectively disposed between the first insulating film 601 and the plurality of second spacers 507 that are adjacent to the low-level bit line bottom contact 403; in other words, the plurality of first spacers 503 may be respectively opposite to the low-level bit line bottom contact 403 with the plurality of second spacers 507 that are adjacent to the low-level bit line bottom contact 403 interposed therebetween. The plurality of first spacers 503 may be formed of, for example, a material having etching selectivity with respect to the first insulating film 601, the plurality of second spacers 507, and the second liner 517. Specifically, in the embodiment depicted, the plurality of first spacers 503 are formed of doped oxide such as borosilica glass, phosphosilica glass, borophosphosilica glass, fluoride silicate glass, carbon doped silicon oxide, or the like. Alternatively, in another embodiment, the plurality of first spacers 503 may be formed of a thermal decomposable polymer or a thermal degradable polymer. Thermal decomposable polymer or Thermal degradable polymer decomposes or degrades into a gaseous state when exposed to a temperature exceeding the decomposition temperature of Thermal decomposable polymer or the degradation temperature of Thermal degradable polymer.

With reference to FIG. 1, in the embodiment depicted, the plurality of air gaps may be respectively correspondingly disposed adjacent to the high-level bit line bottom contact 303 and the low-level bit line 401. Specifically, the plurality of air gaps may include first air gaps 511 and second air gaps 513. The second air gaps 513 may be respectively disposed adjacent to the plurality of second spacers 507 that are adjacent to the high-level bit line bottom contact 303; in other words, the second air gaps 513 may be respectively opposite to the high-level bit line bottom contact 303 with the plurality of second spacers 507 that are adjacent to the high-level bit line bottom contact 303 interposed therebetween. The second air gaps 513 may be spaces surrounded by the plurality of second spacers 507 that are adjacent to the high-level bit line bottom contact 303, the first insulating film 601, the second insulating film 603, the third insulating film 605, and the plurality of doped regions 109 disposed between the adjacent pair of the plurality of word lines 201 in the first active area 105.

With reference to FIG. 1, in the embodiment depicted, the first air gaps 511 may be respectively disposed adjacent to the plurality of second spacers 507 that are adjacent to the low-level bit line 401; in other words, the first air gaps 511 may be respectively opposite to the low-level bit line 401 with the plurality of second spacers 507 that are adjacent to the low-level bit line 401 interposed therebetween. The first air gaps 511 may be spaces surrounded by the first insulating film 601, the second insulating film 603, the third insulating film 605, and the plurality of second spacers 507 that are adjacent to the low-level bit line 401. Because the second air gaps 513 and the first air gaps 511 are filled with air, a dielectric constant of the second air gaps 513 and the first air gaps 511 may be remarkably lower than that of the insulating films formed of, for example, silicon oxide. Therefore, the second air gaps 513 and the first air gaps 511 may significantly reduce the parasitic capacitance between the high-level bit line bottom contact 303 and the low-level bit line 401. That is to say, the second air gaps 513 and the first air gaps 511 may remarkably alleviate an interference effect between electrical signals induced or applied to the high-level bit line bottom contact 303 and the low-level bit line 401.

With reference to FIG. 1, in the embodiment depicted, the plurality of conductive plugs 111 may be disposed in and penetrating through the fifth insulating film 609, the fourth insulating film 607, the third insulating film 605, the second insulating film 603, and the first insulating film 601. The plurality of conductive plugs 111 may be respectively correspondingly disposed on the plurality of doped regions 109 disposed between the isolation layer 103 and the plurality of word lines 201 in both the first active area 105 and the second active area 107. The plurality of conductive plugs 111 may be respectively correspondingly electrically connected to the plurality of doped regions 109 disposed between the isolation layer 103 and the plurality of word lines 201 in both the first active area 105 and the second active area 107. The plurality of conductive plugs 111 may be formed of doped polysilicon, titanium, titanium nitride, tantalum, tantalum nitride, tungsten, copper, aluminum or aluminum alloy.

With reference to FIG. 1, in the embodiment depicted, the plurality of capacitor structures 113 may be disposed in the sixth insulating film 611 and respectively correspondingly on the plurality of conductive plugs 111. The plurality of capacitor structures 113 may be respectively correspondingly electrically connected to the plurality of conductive plugs 111. The plurality of capacitor structures 113 may include a plurality of capacitor bottom electrodes 115, a capacitor insulating layer 117, and a capacitor top electrode 119.

With reference to FIG. 1, in the embodiment depicted, the plurality of capacitor structures 113 may be inwardly disposed in the sixth insulating film 611 and respectively correspondingly electrically connected to the plurality of conductive plugs 111. Specifically, each of the plurality of capacitor structures 113 may be formed in a U-shaped pattern. The plurality of capacitor structures 113 may be formed of doped polysilicon, metal, or metal silicide. The capacitor insulating layer 117 may be disposed on the plurality of capacitor bottom electrodes 115. The capacitor insulating layer 117 may be formed of a single layer including an insulating material having a dielectric constant of about 4.0 or greater. A thickness of the capacitor insulating layer 117 may be between about 1 angstrom and about 100 angstroms. Alternatively, in another embodiment, the capacitor insulating layer 117 may be formed of a stacked layer consisting of silicon oxide, silicon nitride, and silicon oxide. The capacitor top electrode 119 may be disposed on the capacitor insulating layer 117. The capacitor top electrode 119 may be formed of doped polysilicon or metal.

FIGS. 2 to 7 illustrate, in schematic cross-sectional view diagrams, some semiconductor devices in accordance with some embodiments of the present disclosure.

Figure 2:
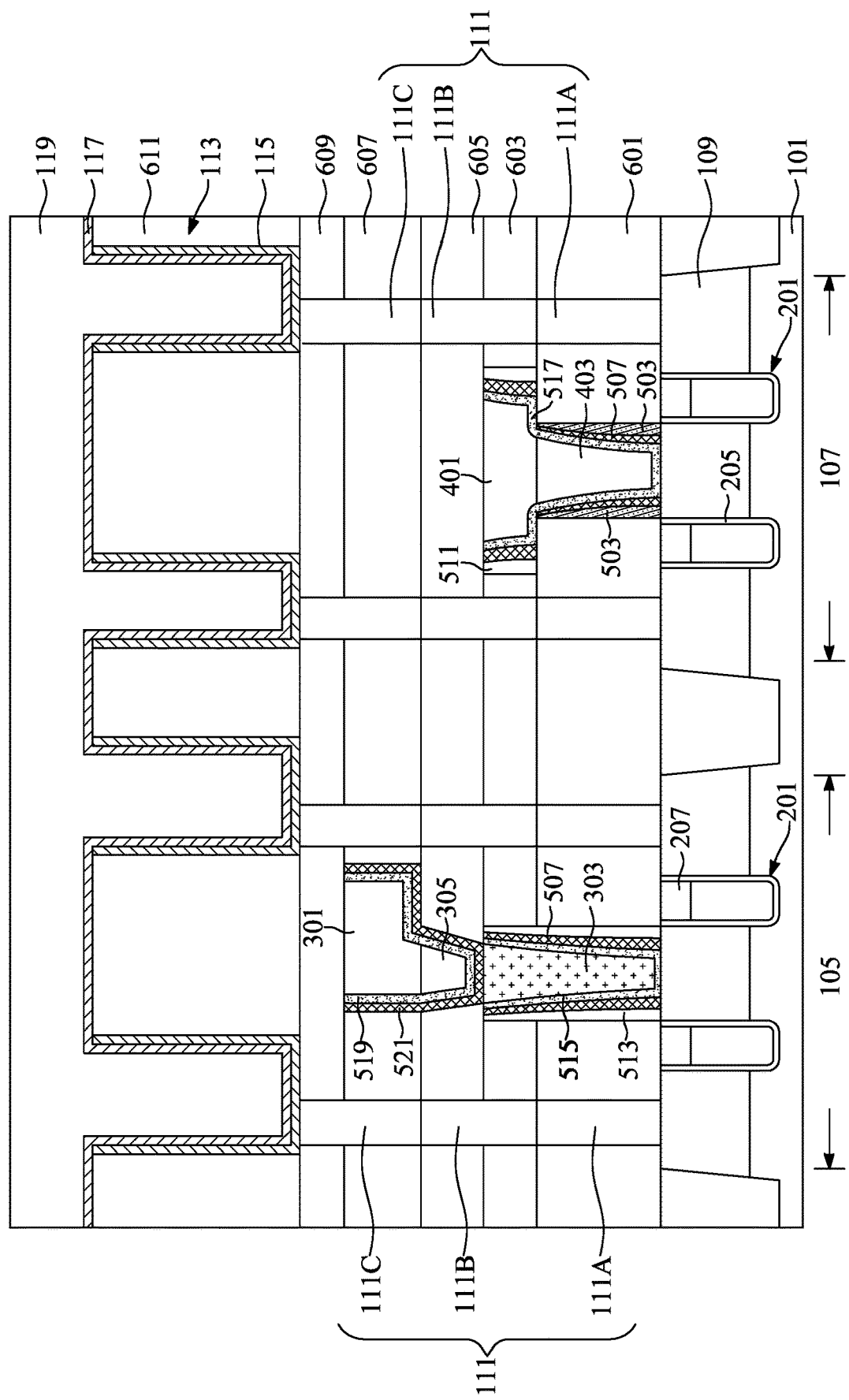
FIGS. 2 to 7 illustrate, in schematic cross-sectional view diagrams, some semiconductor devices in accordance with some embodiments of the present disclosure.

With reference to FIG. 2, in another embodiment, a protection layer 521 may be disposed between and attached to the third liner 519 and the fourth insulating film 607, between and attached to the third liner 519 and the third insulating film 605, and between and attached to the third liner 519 and the high-level bit line bottom contact 303. A portion of the protection layer 521 may be disposed on the top surface of the high-level bit line bottom contact 303. The protection layer 521 may include tungsten nitride. Defects may be easily formed on the top surface of the high-level bit line bottom contact 303 while the high-level bit line bottom contact 303 is formed including tungsten and is exposed to oxygen or air. The defects may affect the yield of the semiconductor device. The protection layer 521 may prevent the top surface of the high-level bit line bottom contact 303 formed including tungsten from being exposed to oxygen or air; therefore, the protection layer 521 may reduce formation of the defects on the top surface of the high-level bit line bottom contact 303 formed including tungsten.

Figure 3:
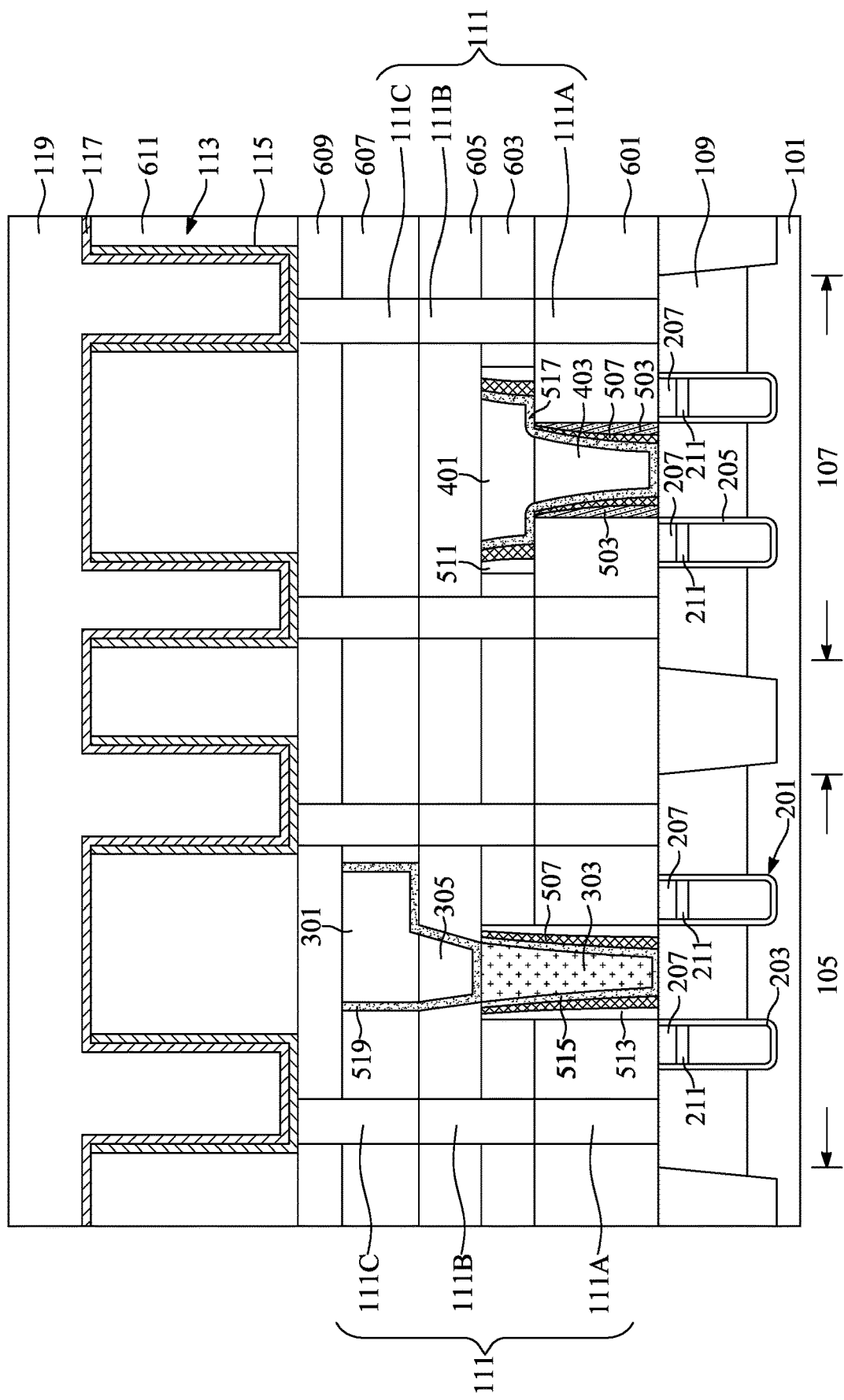

With reference to FIG. 3, in another embodiment, a plurality of word line second capping layers 211 may be respectively correspondingly disposed between the plurality of word line first capping layers 207 and the plurality of word line electrodes 205. Sidewalls of the plurality of word line second capping layers 211 may directly contact the inner surfaces of the plurality of word line insulating layers 203. The plurality of word line second capping layers 211 may be formed of an insulating material having a dielectric constant of about 4.0 or greater. The plurality of word line first capping layers 207 may be formed of a low dielectric-constant material such as silicon oxide, silicon nitride, silicon oxynitride, silicon nitride oxide, fluoride-doped silicate, or the like. The plurality of word line first capping layers 207 formed of the low dielectric-constant material may reduce electric field at the top surface of the substrate 101; therefore, leakage current may be reduced.

Figure 4:
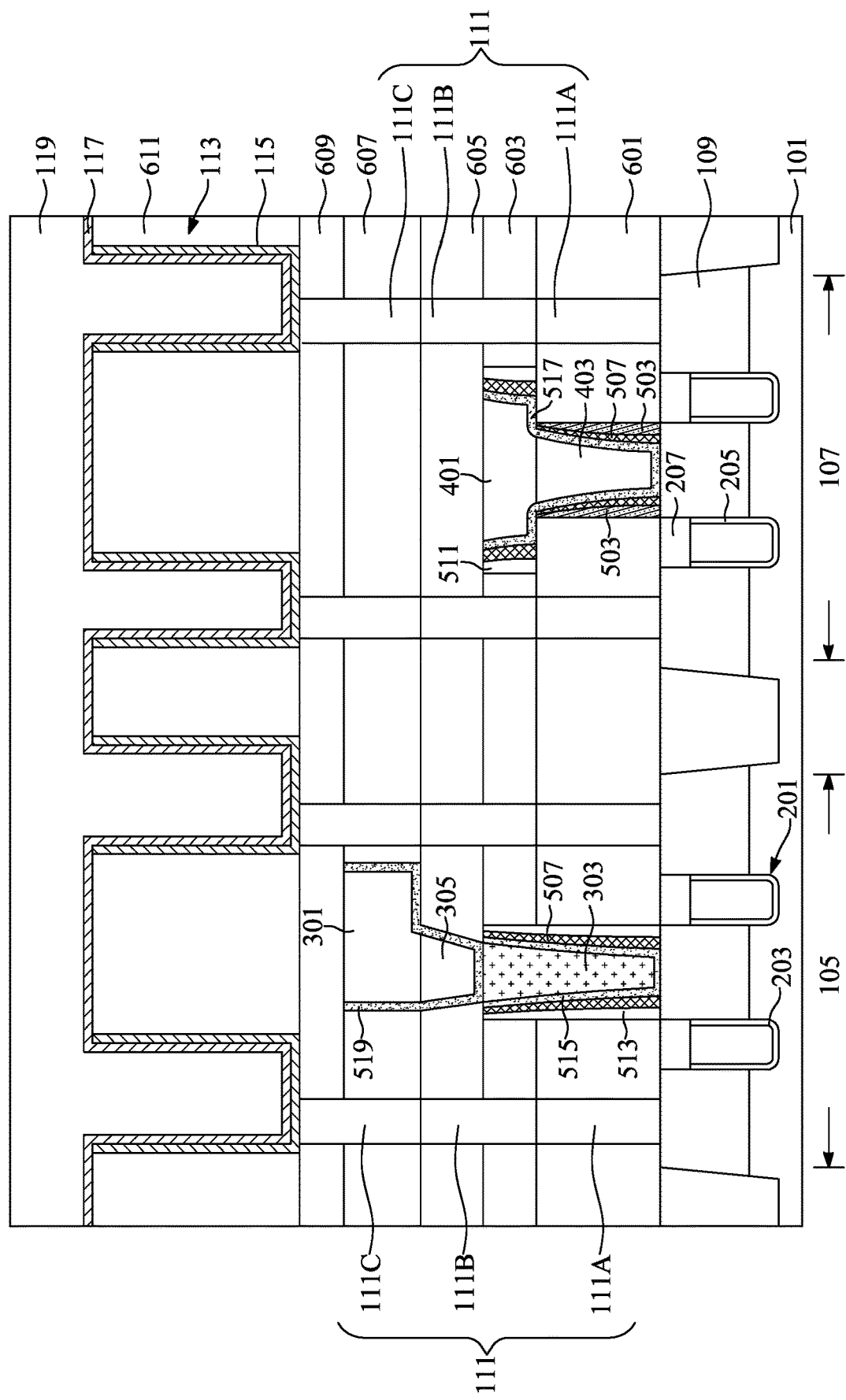

With reference to FIG. 4, in another embodiment, the plurality of word line first capping layers 207 may be respectively correspondingly disposed on the plurality of word line insulating layers 203 and the plurality of word line electrodes 205. The sidewalls of the plurality of word line first capping layers 207 may directly contact inner surfaces of the substrate 101.

Figure 5:
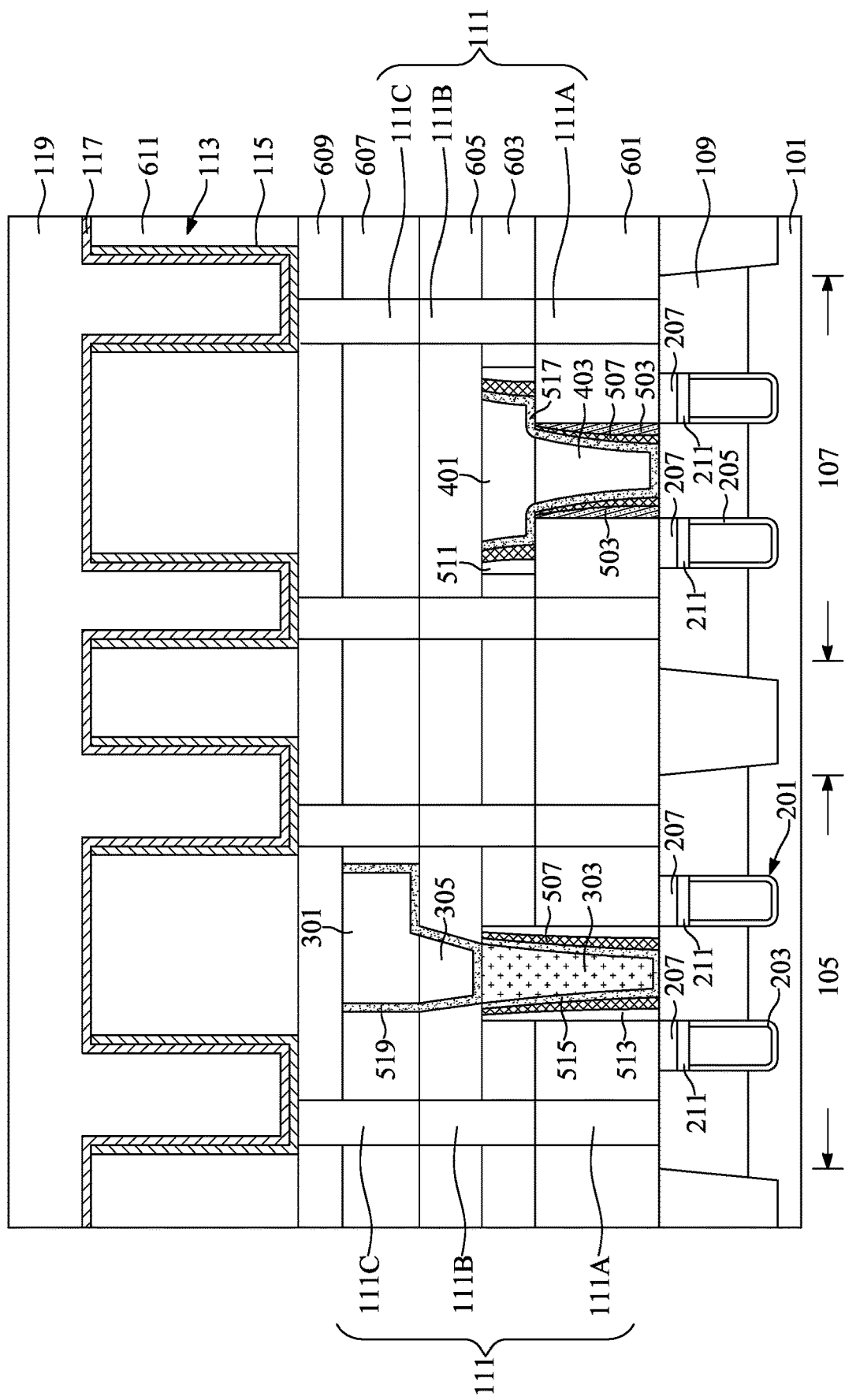

With reference to FIG. 5, in another embodiment, the plurality of word line second capping layers 211 may be respectively correspondingly disposed on the plurality of word line electrodes 205 and the plurality of word line insulating layers 203. The plurality of word line first capping layers 207 may be respectively correspondingly disposed on the plurality of word line second capping layers 211. The sidewalls of the plurality of word line second capping layers 211 and the sidewalls of the plurality of word line first capping layers 207 may directly contact the inner surfaces of the substrate 101. The plurality of word line second capping layers 211 may be formed of an insulating material having a dielectric constant of about 4.0 or greater. The plurality of word line first capping layers 207 may be formed of a low dielectric-constant material such as silicon oxide, silicon nitride, silicon oxynitride, silicon nitride oxide, fluoride-doped silicate, or the like. The plurality of word line first capping layers 207 formed of the low dielectric-constant material may reduce the electric field at the top surface of the substrate 101; therefore, leakage current may be reduced.

Figure 6:
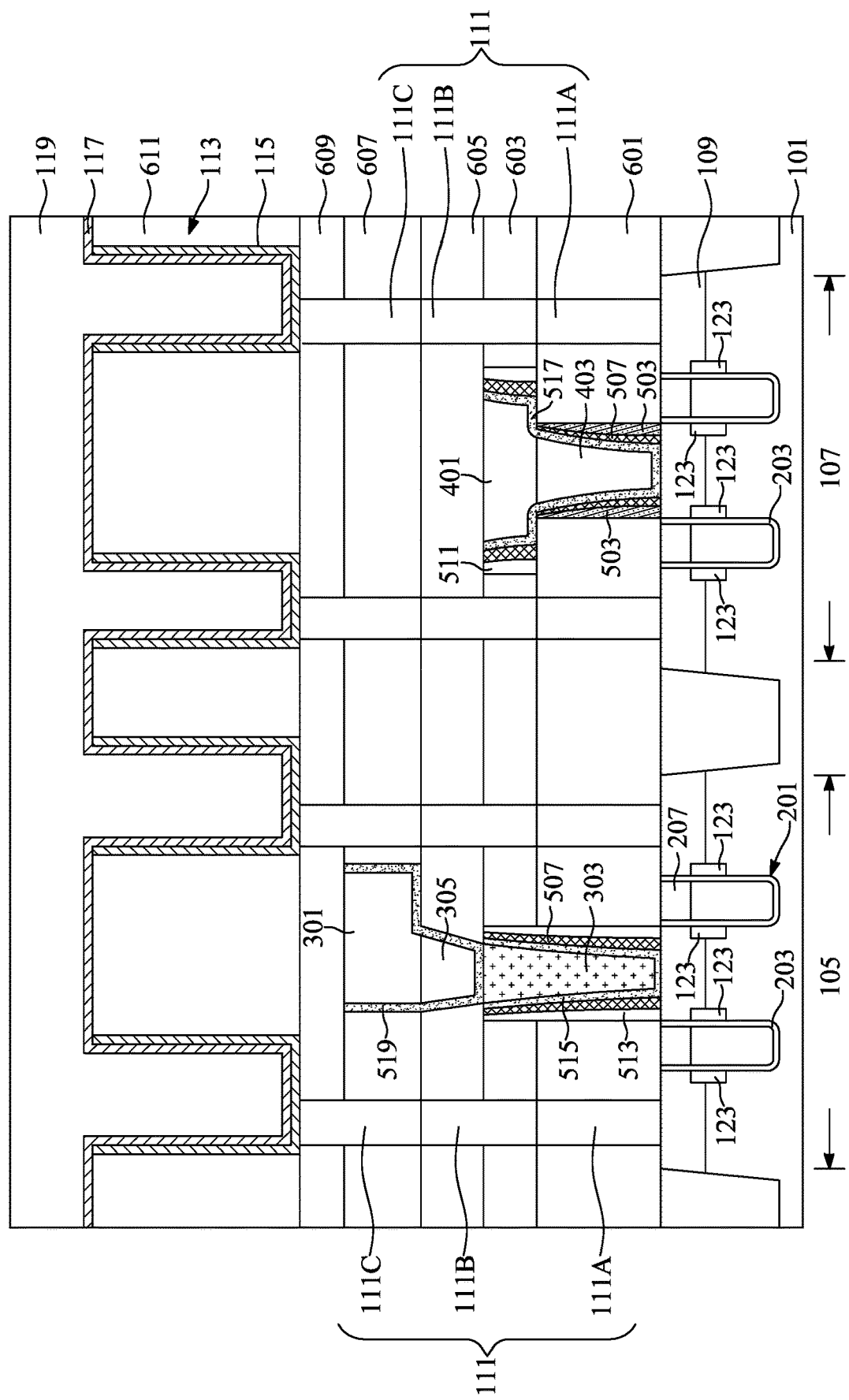

With reference to FIG. 6, in another embodiment, a plurality of lightly doped regions 123 may be respectively correspondingly disposed adjacent to two sides of the plurality of word line insulating layers 203. The plurality of lightly doped regions 123 may be disposed at interfaces of the plurality of doped regions 109 and the substrate 101. The plurality of lightly doped regions 123 may be doped with a same dopant as that used to dope the plurality of doped regions 109. A dopant concentration of the plurality of lightly doped regions 123 may be lower than a dopant concentration of the plurality of doped regions 109. The plurality of lightly doped regions 123 may alleviate hot-electron effect.

Figure 7:
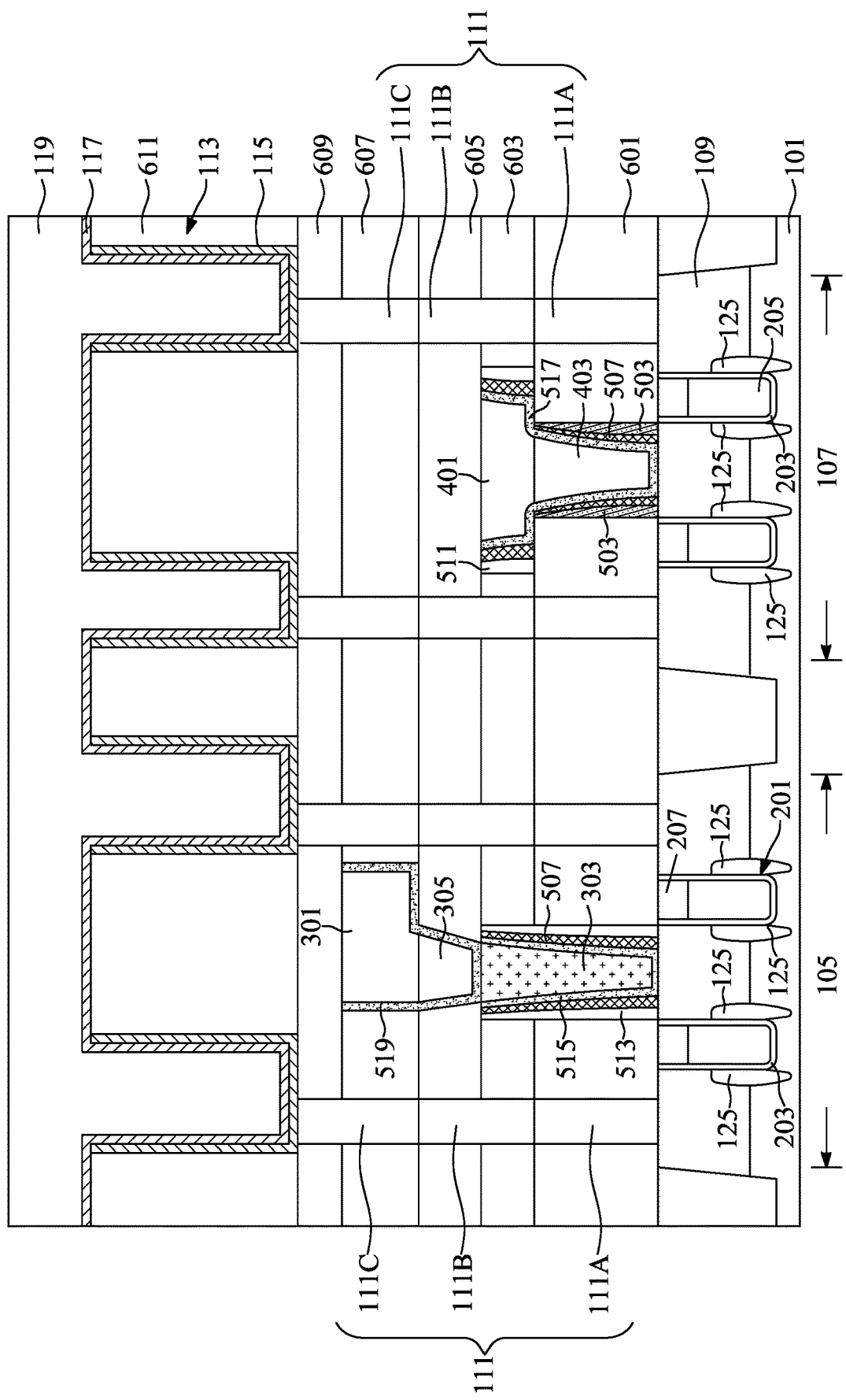

With reference to FIG. 7, in another embodiment, a plurality of stressor regions 125 may be respectively correspondingly disposed adjacent to two sides of the plurality of word line insulating layers 203. Bottoms of the plurality of stressor regions 125 may be at a vertical level lower than the vertical level of the bottoms of the plurality of word line insulating layers 203. The plurality of stressor regions 125 may have a lattice constant different from a lattice constant of the substrate 101. The plurality of stressor regions 125 may increase the carrier mobility of the semiconductor device; therefore, the performance of the semiconductor device may be improved.

Figure 8:
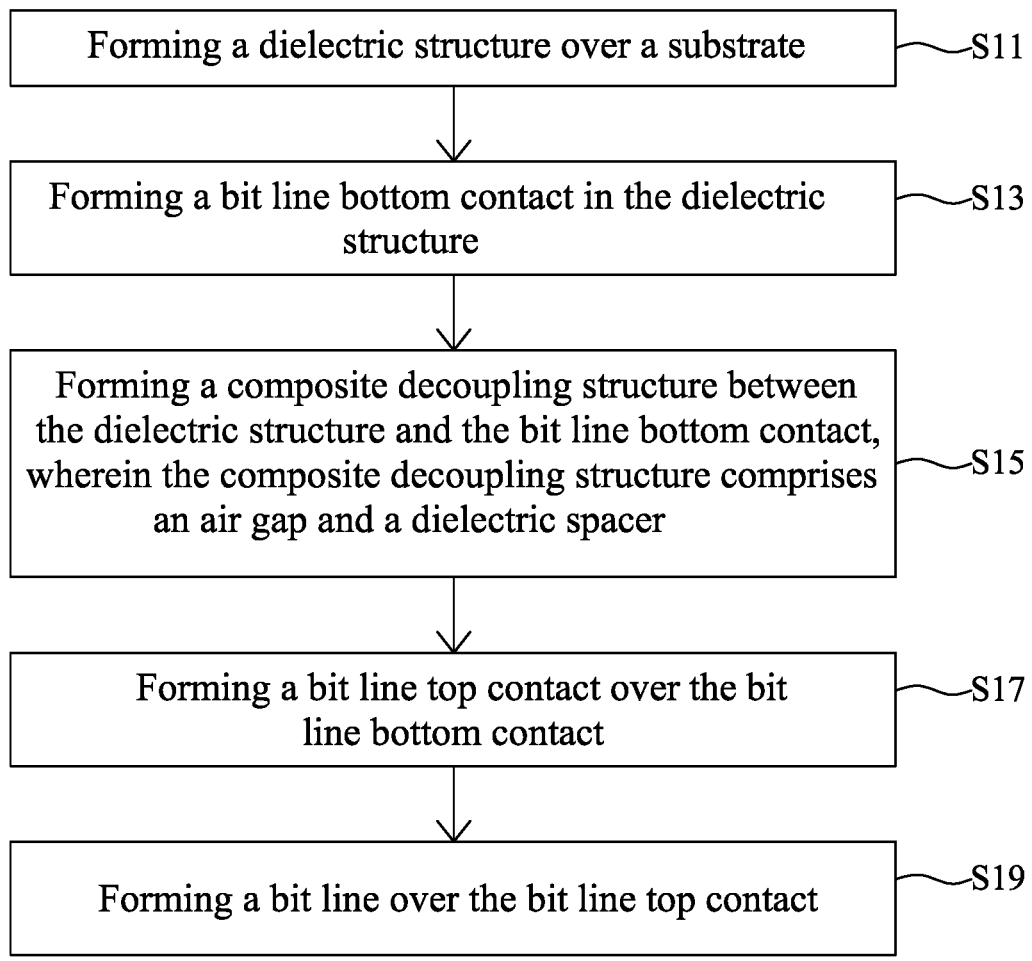
FIG. 8 illustrates, in a flowchart diagram form, a method for fabricating a semiconductor device in accordance with one embodiment of the present disclosure.

FIG. 8 illustrates, in a flowchart diagram form, a method 10 for fabricating a semiconductor device in accordance with one embodiment of the present disclosure. In some embodiments, the method 10 comprises: step S11, forming a dielectric structure over a substrate; step S13, forming a bit line bottom contact in the dielectric structure; step S15, forming a composite decoupling structure between the dielectric structure and the bit line bottom contact, wherein the composite decoupling structure comprises an air gap and a dielectric spacer; step S17, forming a bit line top contact over the bit line bottom contact; and step S19, forming a bit line over the bit line top contact.

FIGS. 9 to 32 illustrate, in schematic cross-sectional diagrams, a flow of fabricating a semiconductor device in accordance with one embodiment of the present disclosure.

Figure 9:
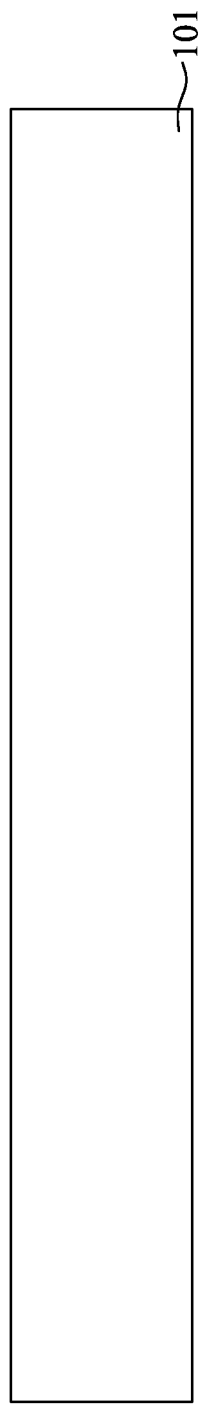
FIGS. 9 to 34 illustrate, in schematic diagrams, a flow of fabricating a semiconductor device in accordance with one embodiment of the present disclosure.
Figure 10:
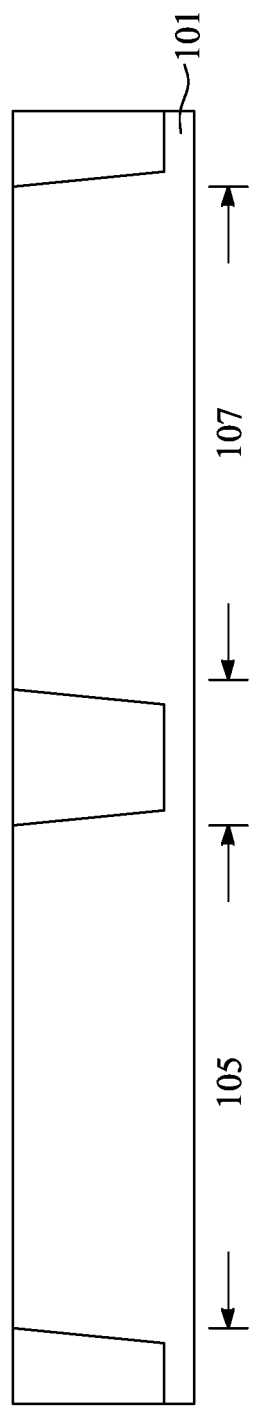

With reference to FIG. 8 and FIG. 9, a substrate 101 may be provided. With reference to FIG. 8 and FIG. 10, an isolation layer 103 may be formed in the substrate 101. The isolation layer 103 may define a plurality of active areas of the substrate 101. The plurality of active areas may include a first active area 105 and a second active area 107. The first active area 105 and the second active area 107 may be adjacent to each other.

Figure 11:
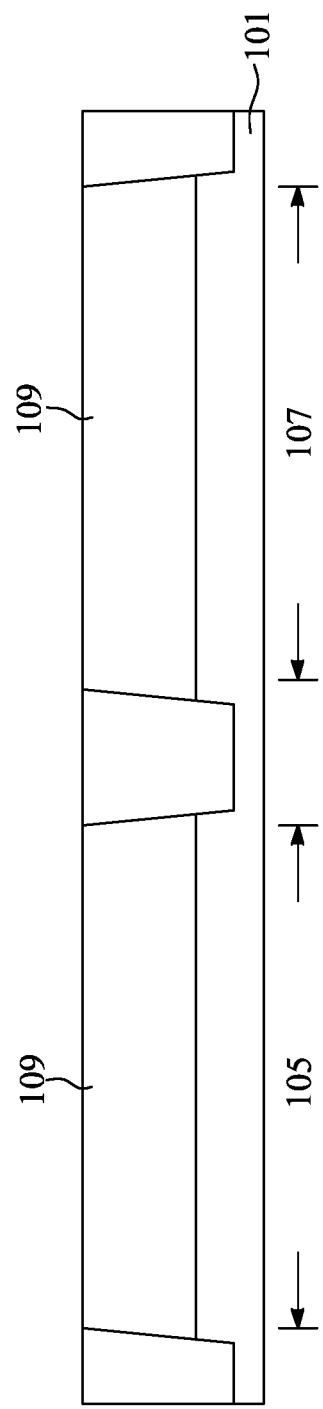

With reference to FIG. 8 and FIG. 11, a plurality of doped regions 109 may be formed in an upper portion of the first active area 105 of the substrate 101 and an upper portion of the second active area 107 of the substrate 101. The plurality of doped regions 109 may be doped with a dopant such as phosphorus, arsenic, or antimony.

Figure 12:
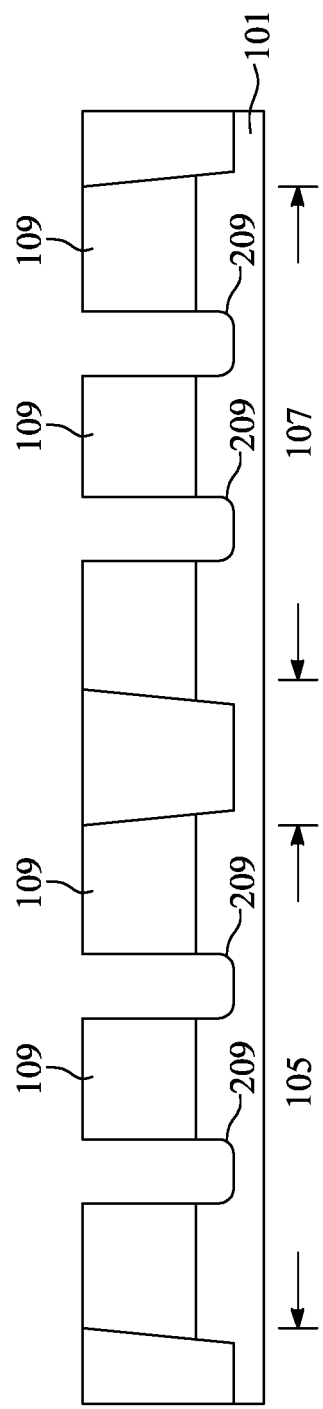

With reference to FIG. 8 and FIGS. 12 to 15, a plurality of word lines 201 may be formed in the upper portion of the first active area 105 and the upper portion of the second active area 107. With reference to FIG. 12, a plurality of word line trenches 209 may be inwardly formed in the upper portion of the first active area 105 and the upper portion of the second active area 107, respectively. Bottoms of the plurality of word line trenches 209 may be flat. The bottoms of the plurality of word line trenches 209 may be at a vertical level lower than a vertical level of bottoms of the plurality of doped regions 109.

Figure 13:
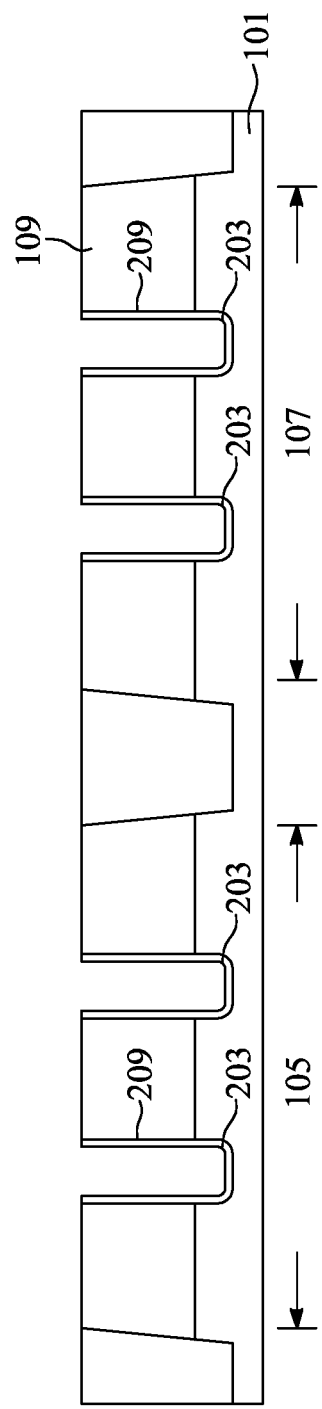
Figure 14:
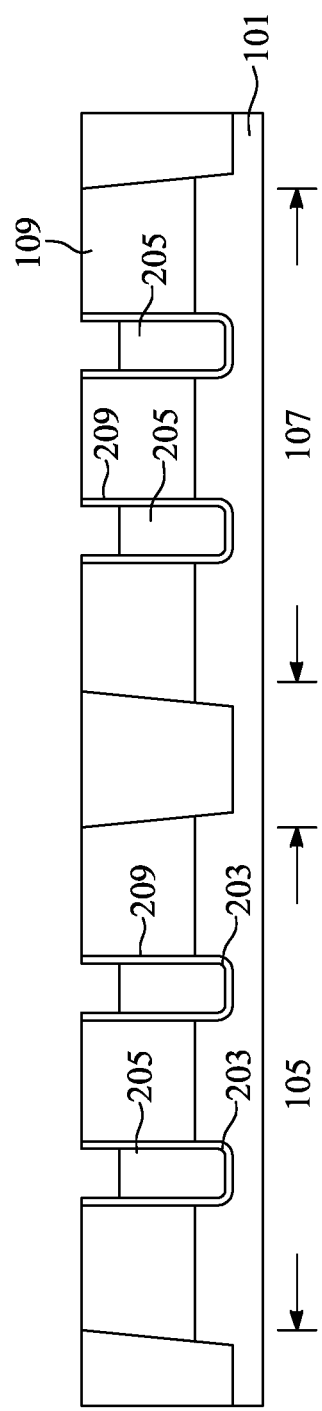
Figure 15:
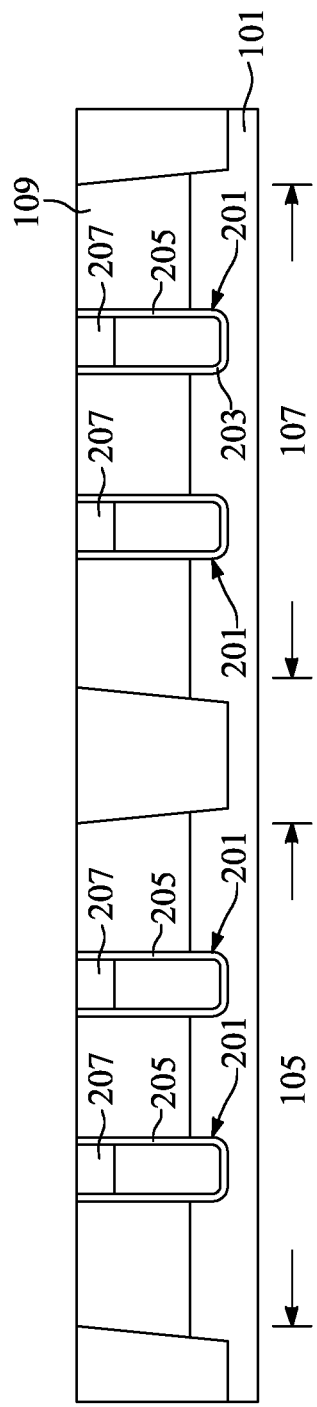

With reference to FIG. 13, a plurality of word line insulating layers 203 may be respectively correspondingly formed in the plurality of word line trenches 209. With reference to FIG. 14, a plurality of word line electrodes 205 may be respectively correspondingly formed on the plurality of word line insulating layers 203 in the plurality of word line trenches 209. With reference to FIG. 15, a plurality of word line first capping layers 207 may be respectively correspondingly formed on the plurality of word line electrodes 205 in the plurality of word line trenches 209. Top surfaces of the plurality of word line first capping layers 207 may be even with a top surface of the substrate 101. The plurality of word line insulating layers 203, the plurality of word line electrodes 205, and the plurality of word line first capping layers 207 together form the plurality of word lines 201.

Figure 16:
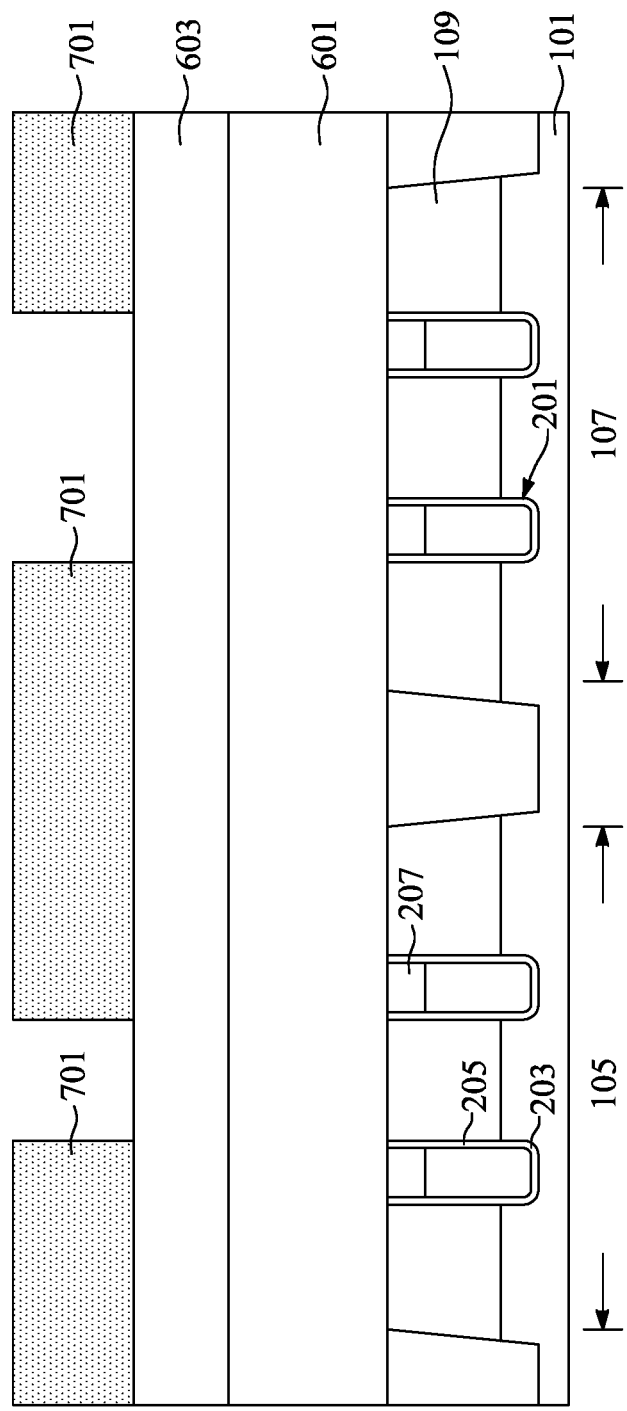
Figure 17:
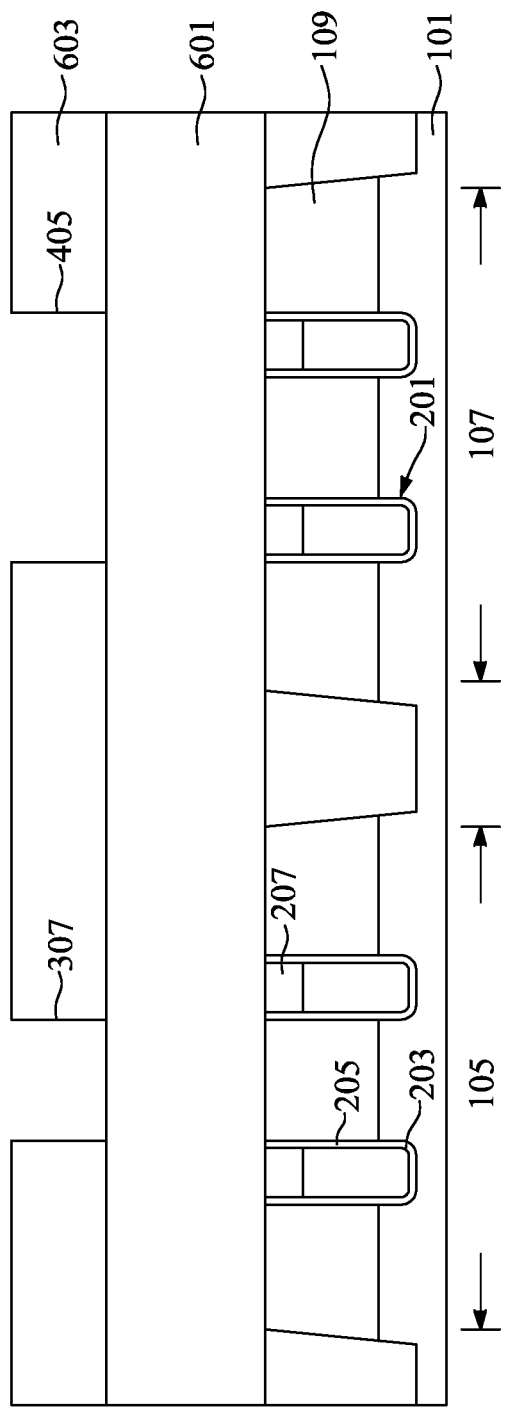

With reference to FIG. 8 and FIGS. 16 to 25, at step S11, a high-level bit line bottom contact 303, a low-level bit line bottom contact 403, and a low-level bit line 401 may be formed above the substrate 101. With reference to FIG. 16, a first insulating film 601 may be formed on the substrate 101 and a second insulating film 603 may be formed on the first insulating film 601. A first photolithography process may be performed using a first mask pattern 701 to define positions of the high-level bit line bottom contact 303 and the low-level bit line 401 on the second insulating film 603. With reference to FIG. 17, a first etch process, such as an anisotropic dry etch process, may be performed after the first photolithography process to form an upper high-level bit line bottom contact opening 307 and a low-level bit line trench 405 in the second insulating film 603.

Figure 18:
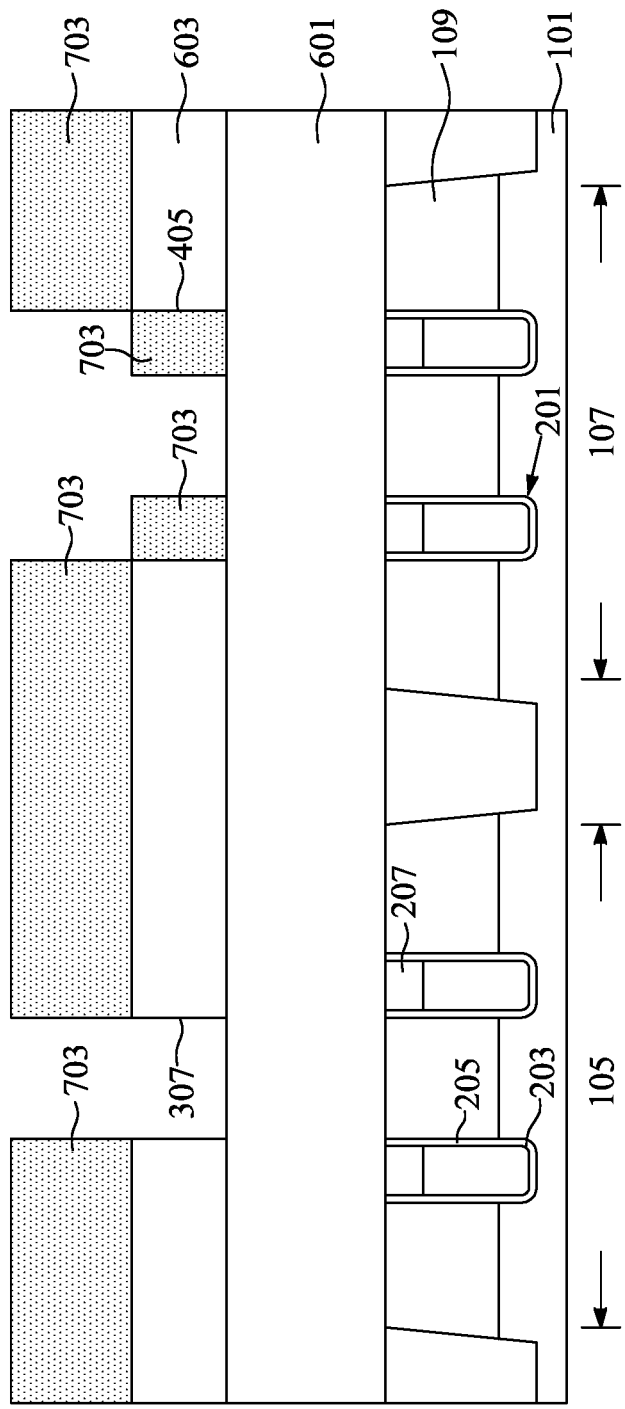
Figure 19:
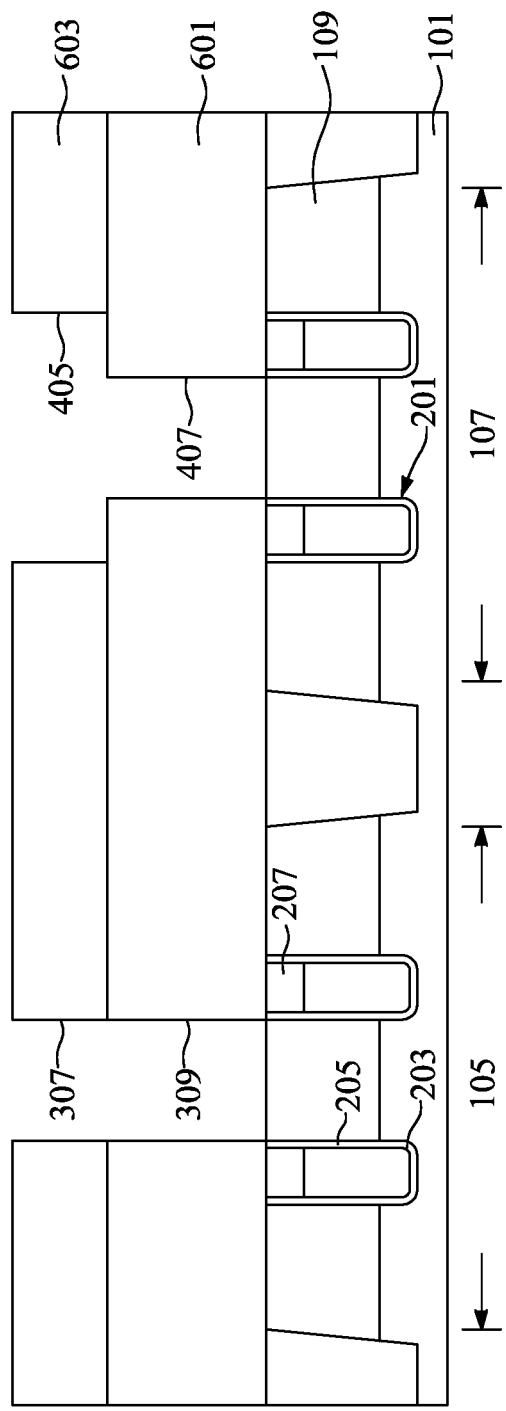

With reference to FIG. 18, at step S13, a bit line bottom contact in the dielectric structure. In some embodiments, a second photolithography process may be performed using a second mask pattern 703 to define the position of the high-level bit line bottom contact 303 and a position of the low-level bit line bottom contact 403 on the first insulating film 601. With reference to FIG. 19, a second etch process, such as an anisotropic dry etch process, may be performed after the second photolithography process to form a lower high-level bit line bottom contact opening 309 and a low-level bit line bottom contact opening 407 in the first insulating film 601. The plurality of doped regions 109 disposed between adjacent pairs of the plurality of word lines 201 in the first active area 105 and between adjacent pairs of the plurality of word lines 201 in the second active area 107 may be respectively exposed through the lower high-level bit line bottom contact opening 309 and the low-level bit line bottom contact opening 407.

Figure 20:
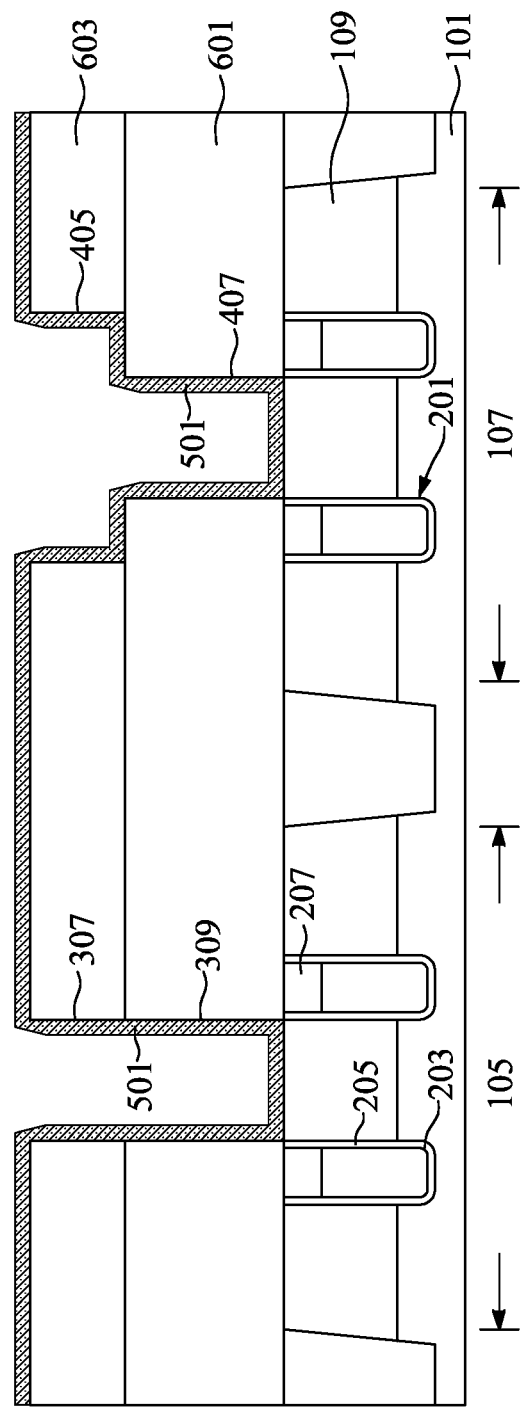

With reference to FIG. 20, a first spacer layer 501 may be formed to cover top surfaces of the second insulating film 603, sidewalls of the upper high-level bit line bottom contact opening 307, sidewalls and bottom of the lower high-level bit line bottom contact opening 309, sidewalls and bottoms of the low-level bit line trench 405, and sidewalls and bottom of the low-level bit line bottom contact opening 407. The first spacer layer 501 may be formed of doped oxide such as borosilica glass, phosphosilica glass, borophosphosilica glass, fluoride silicate glass, carbon doped silicon oxide, or the like. Alternatively, in another embodiment, the first spacer layer 501 may be formed of a thermal decomposable polymer or a thermal degradable polymer.

Figure 21:
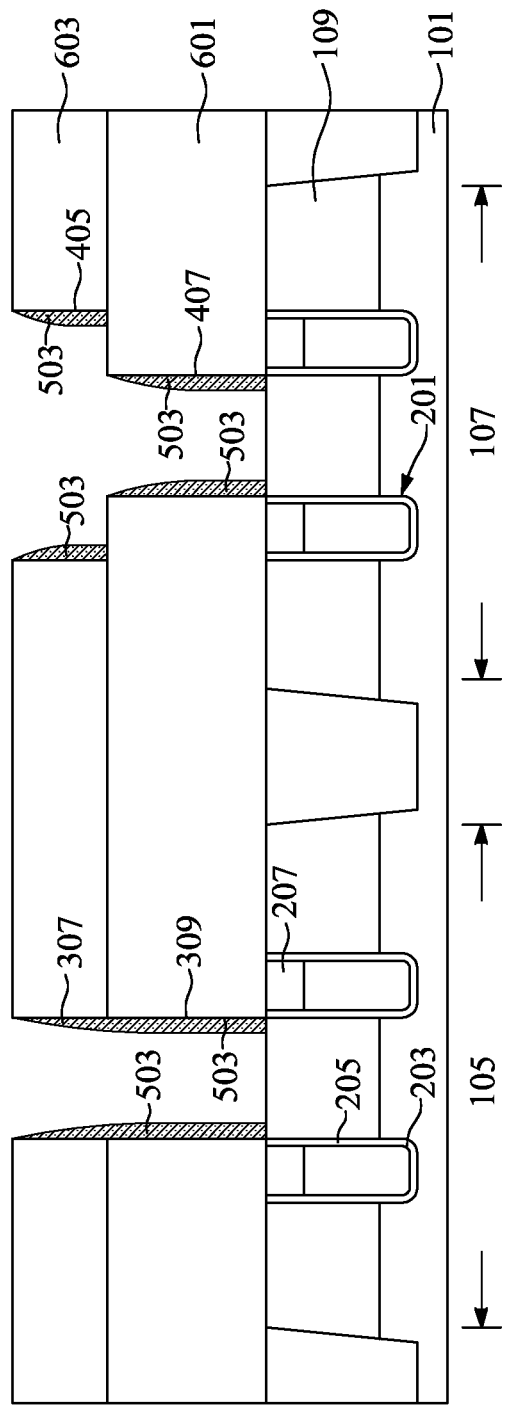
Figure 22:
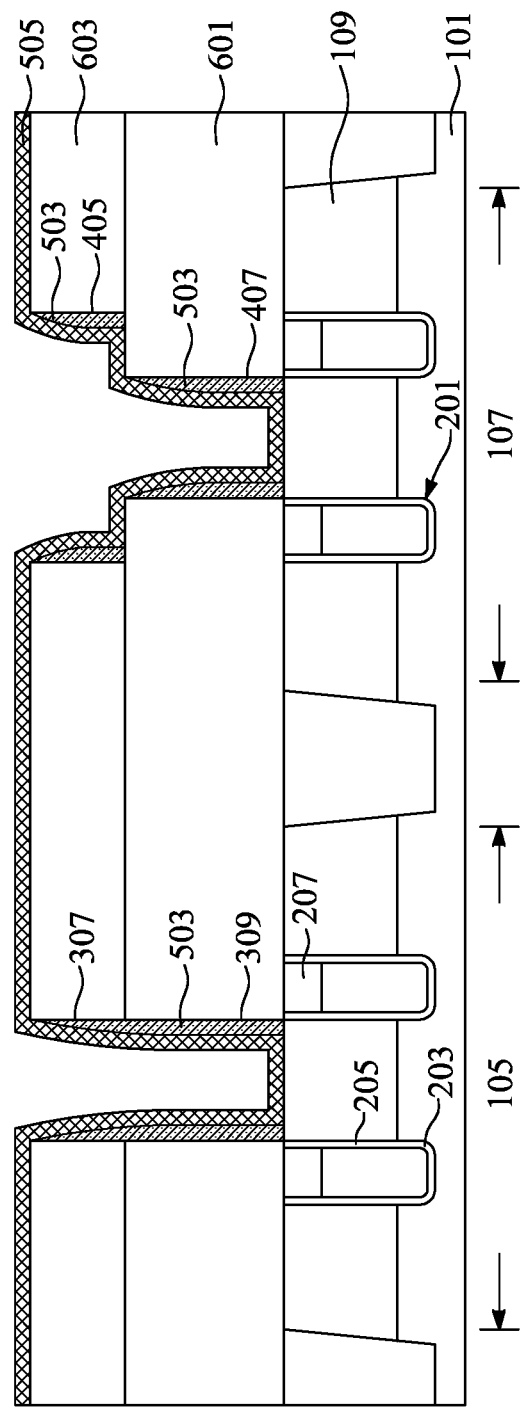

With reference to FIG. 21, an etch process, such as an anisotropic dry etch process, may be performed to form a plurality of first spacers 503 attached to the sidewalls of the upper high-level bit line bottom contact opening 307, the sidewalls of the lower high-level bit line bottom contact opening 309, the sidewalls of the low-level bit line trench 405, and the sidewalls of the low-level bit line bottom contact opening 407. With reference to FIG. 22, a second spacer layer 505 may be formed to cover the top surfaces of the second insulating film 603, the bottoms of the low-level bit line trench 405, the bottom of the low-level bit line bottom contact opening 407, and surfaces of the plurality of first spacers 503. The second spacer layer 505 may be formed of, for example, silicon nitride.

Figure 23:
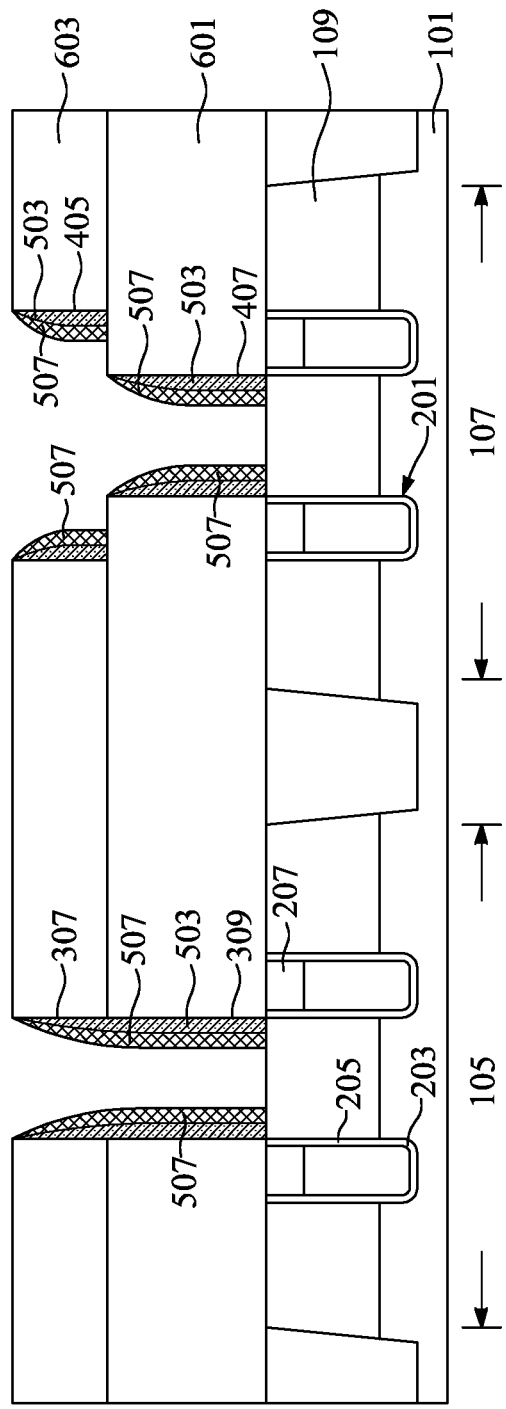
Figure 24:
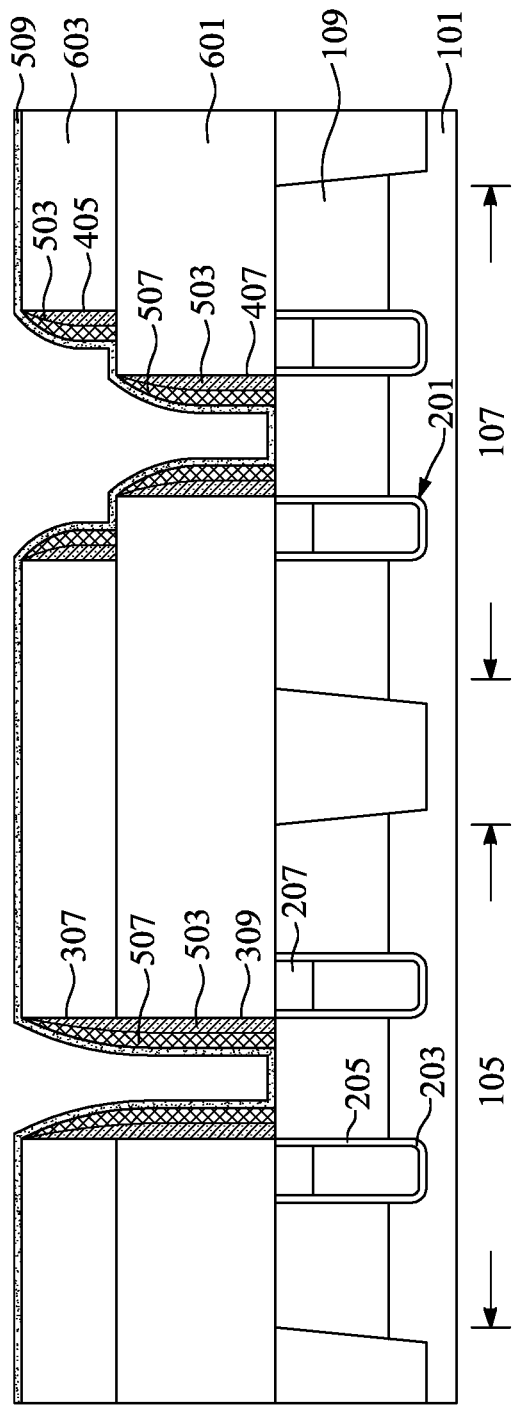

With reference to FIG. 23, an etch process, such as an anisotropic dry etch process, may be performed to form a plurality of second spacers 507 attached to the surfaces of the plurality of first spacers 503. With reference to FIG. 24, a liner layer 509 may be formed to cover the top surfaces of the second insulating film 603, surfaces of the plurality of second spacers 507, the bottoms of the low-level bit line trench 405, and the bottom of the low-level bit line bottom contact opening 407. The liner layer 509 may be formed of, for example, titanium, titanium nitride, titanium silicon nitride, tantalum, tantalum nitride, tantalum silicon nitride, or a combination thereof.

Figure 25:
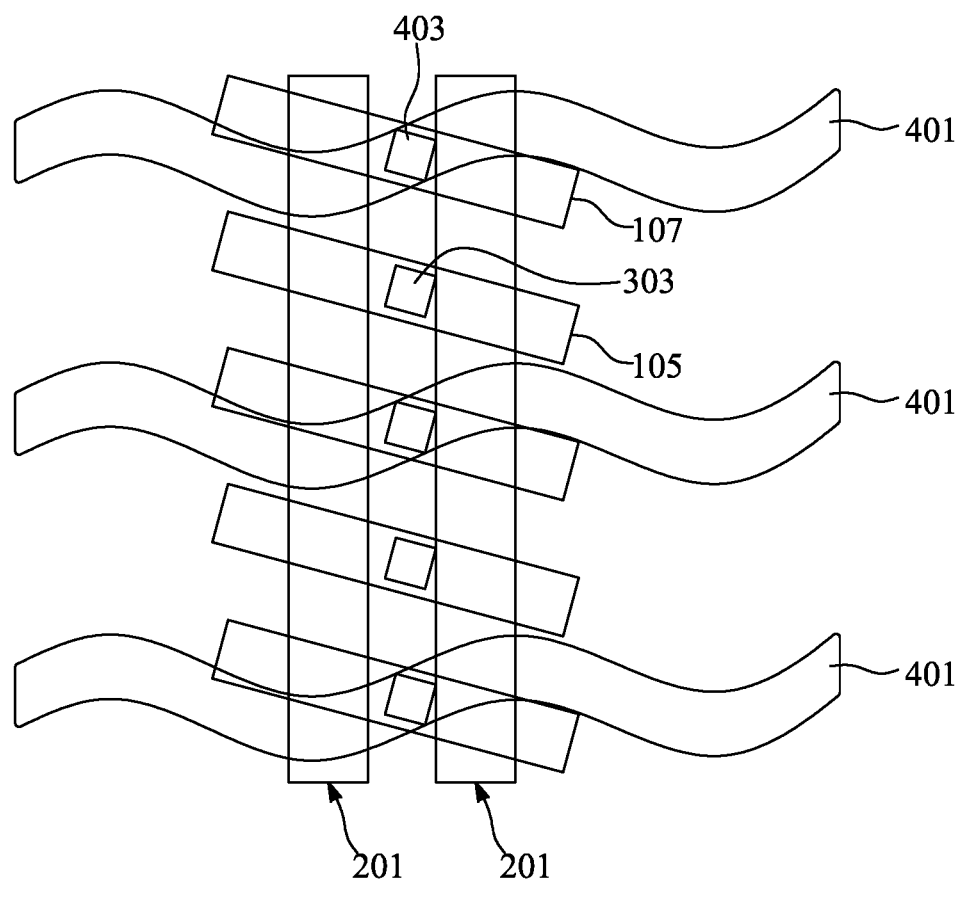
Figure 26:
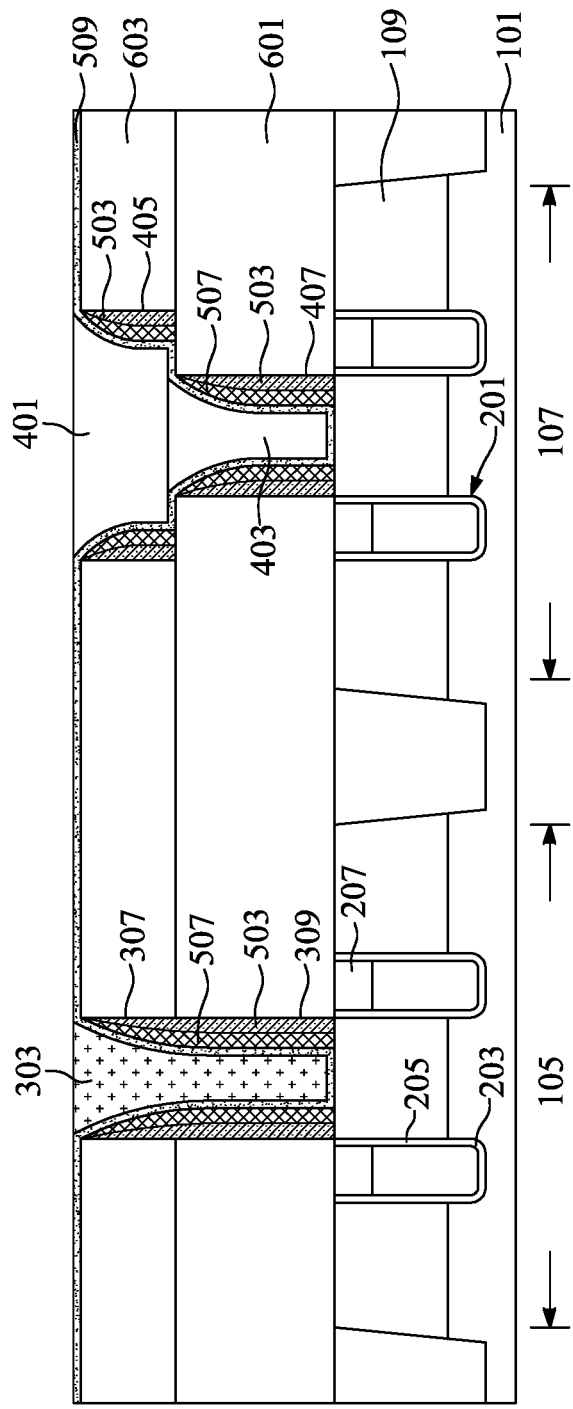

With reference to FIG. 25 and FIG. 26, FIG. 25 illustrates, in a schematic top-view diagram, and FIG. 26 illustrates, in a schematic cross-sectional diagram, part of the flow of fabricating the semiconductor device in accordance with one embodiment of the present disclosure. In some embodiments, a conductive material, for example, doped polysilicon, metal, metal nitride, or metal silicide, may be deposited into the upper high-level bit line bottom contact opening 307, the lower high-level bit line bottom contact opening 309, the low-level bit line trench 405, and the low-level bit line bottom contact opening 407 by a metallization process. In the embodiment depicted, the conductive material may be tungsten. After the metallization process, a planarization process, such as chemical mechanical polishing, may be performed to remove excess filling material, provide a substantially flat surface for subsequent processing steps, and conformally form the high-level bit line bottom contact 303, the low-level bit line bottom contact 403, and the low-level bit line 401. In some embodiments, the low-level bit line 401 is a wavy conductive line.

Figure 27:
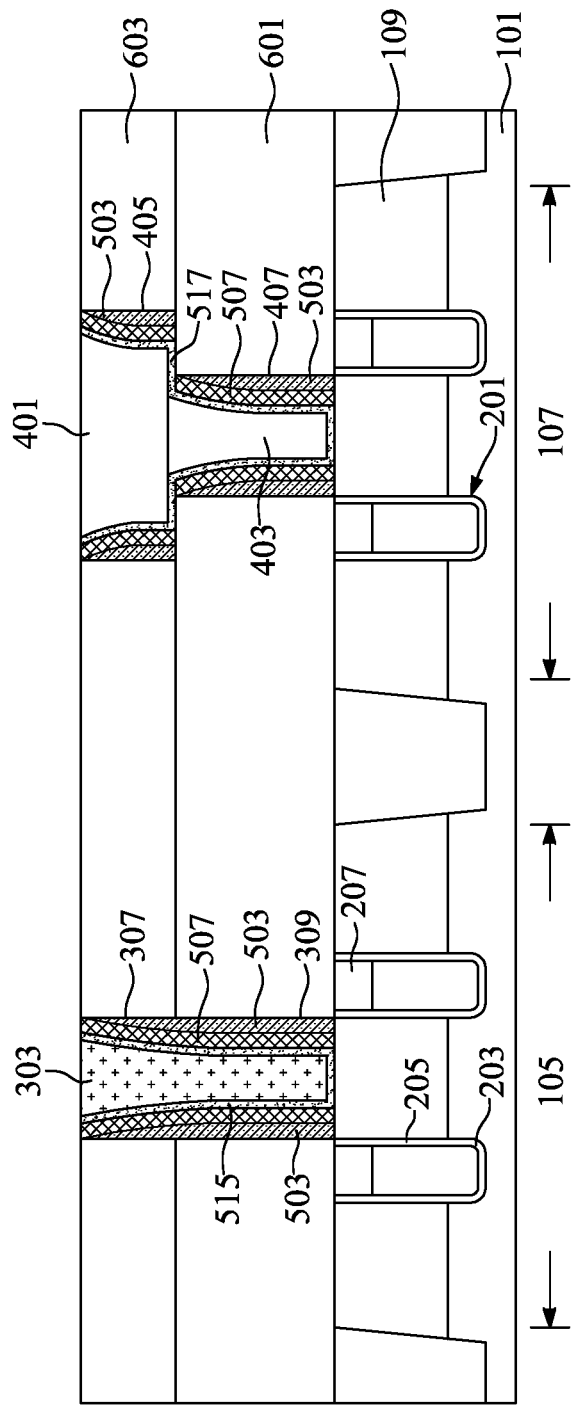
Figure 28:
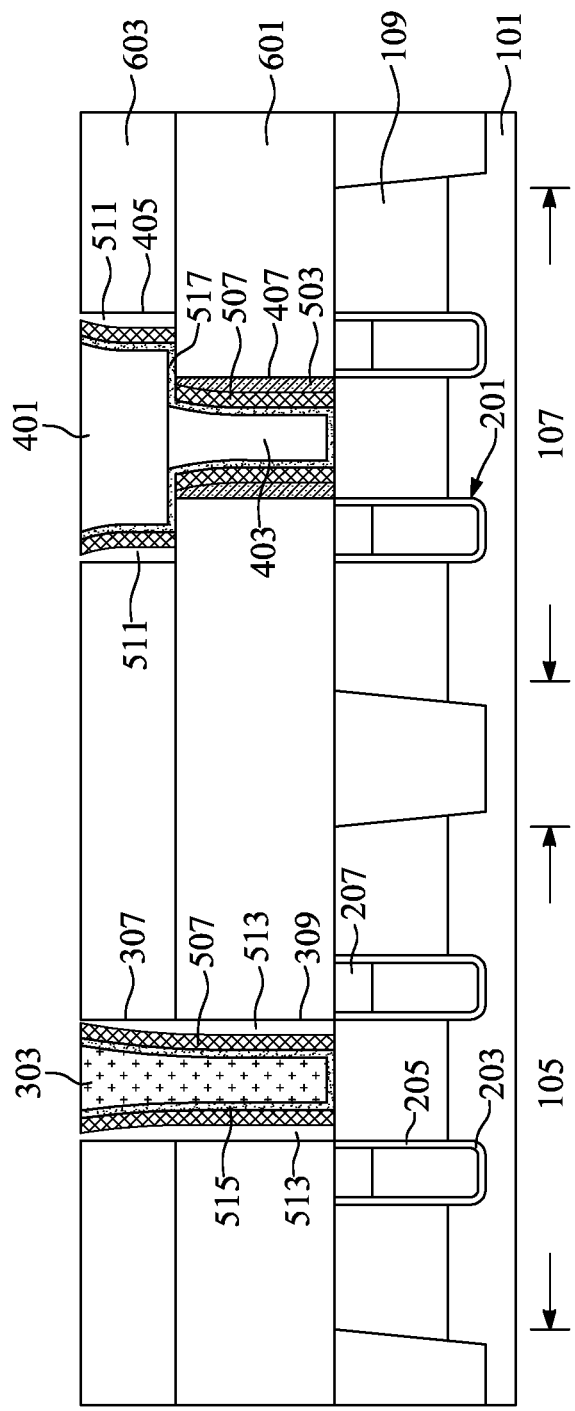

With reference to FIG. 8 and FIGS. 27 to 28, a plurality of air gaps may be formed above the substrate 101. With reference to FIG. 27, a planarization process, such as chemical mechanical polishing, may be performed to reduce a thickness of the fifth insulating film 609 and remove part of the liner layer 509. After the planarization process, the liner layer 509 may be turned into a first liner 515 disposed adjacent to sidewalls of the high-level bit line bottom contact 303 and a second liner 517 disposed on and attached to the sidewalls of the low-level bit line 401, sidewalls of the low-level bit line bottom contact 403, a bottom of the low-level bit line bottom contact 403, and a portion of a top surface of the first insulating film 601. Top surfaces of the plurality of first spacers 503 disposed adjacent to the high-level bit line bottom contact 303, and top surfaces of the plurality of first spacers 503 disposed adjacent to the low-level bit line 401 may be exposed after the planarization process.

With reference to FIG. 28, at step S15, a composite decoupling structure is formed between the dielectric structure and the bit line bottom contact. In some embodiments, the composite decoupling structure comprises an air gap and a dielectric spacer. In some embodiments, the plurality of first spacers 503 disposed adjacent to the high-level bit line bottom contact 303 and the plurality of first spacers 503 disposed adjacent to the low-level bit line 401 may be removed to form the plurality of air gaps. Specifically, a vapor hydrogen fluoride may be introduced and may etch the plurality of first spacers 503 disposed adjacent to the high-level bit line bottom contact 303 and the plurality of first spacers 503 disposed adjacent to the low-level bit line 401. The vapor hydrogen fluoride has a higher etching rate on the plurality of first spacers 503 formed of doped oxide; therefore, the plurality of first spacers 503 disposed adjacent to the high-level bit line bottom contact 303 and the plurality of first spacers 503 disposed adjacent to the low-level bit line 401 may be removed and the plurality of second spacers 507 formed of silicon nitride may be retained. The plurality of second spacers 507 may prevent the material of the high-level bit line bottom contact 303, the low-level bit line 401, or the low-level bit line bottom contact 403 from flowing into the plurality of air gaps during subsequent processing steps such as heat treatment. The plurality of air gaps may include first air gaps 511 and second air gaps 513. The first air gaps 511 may be disposed adjacent to the low-level bit line 401. The second air gaps 513 may be disposed adjacent to the high-level bit line bottom contact 303.

With reference to FIG. 28, alternatively, in another embodiment, a heat process is applied to remove the plurality of first spacers 503 formed of thermal decomposable polymer or thermal degradable polymer. A temperature of the heat process may be between about 300° C. and about 450° C. Preferably, the temperature of the heat process may be between about 350° C. and about 420° C.

Figure 29:
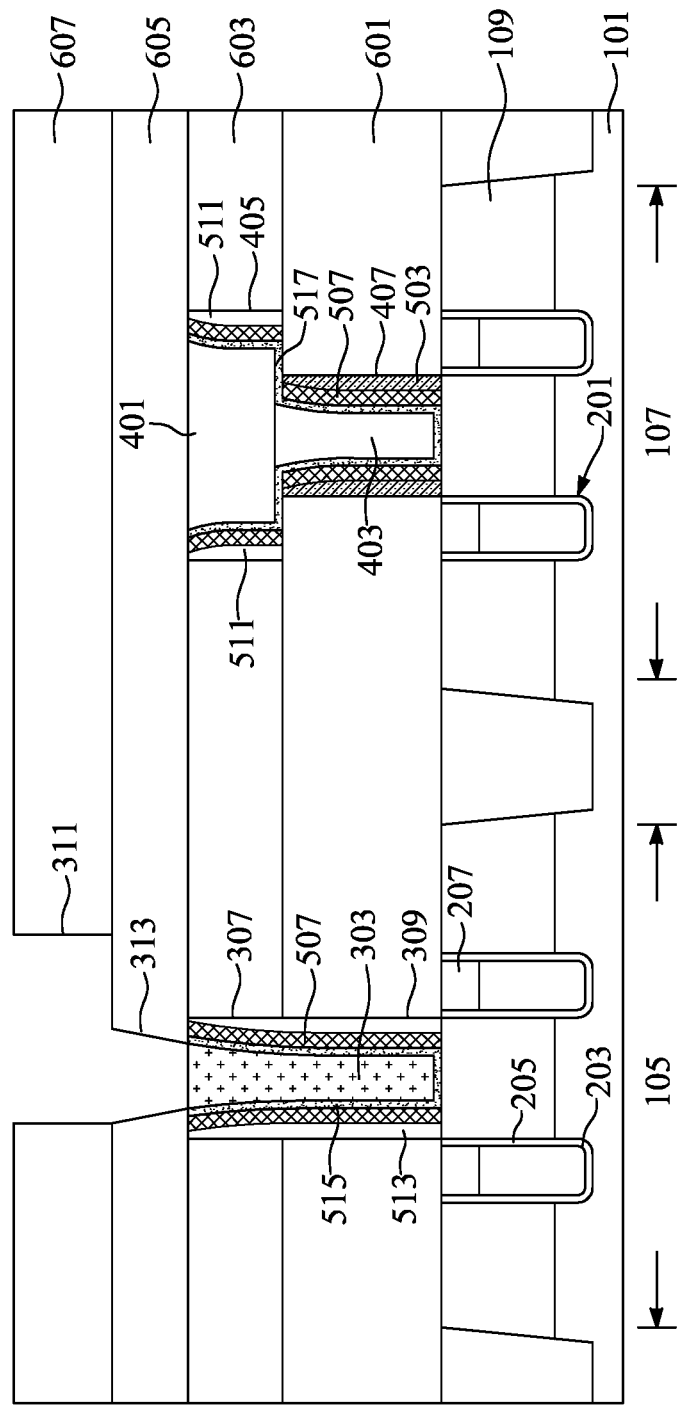

With reference to FIG. 8, at step S17 and S19, a high-level bit line top contact 305 and a high-level bit line 301 may be formed above the substrate 101, respectively. With reference to FIG. 29, a third insulating film 605 may be formed on the second insulating film 603 by, for example, spin-on-glass non-gap fill deposition. It should be noted that the first air gaps 511 and the second air gaps 513 may not be filled after the formation of the third insulating film 605. A fourth insulating film 607 may be formed on the third insulating film 605. A first photolithography process may be performed to define a position of the high-level bit line 301 on the fourth insulating film 607. After the first photolithography process, a first etch process, such as an anisotropic dry etch process, may be performed to form a high-level bit line trench 311 in the fourth insulating film 607. A second photolithography process may be performed to define positions of the high-level bit line top contact 305 on the third insulating film 605.

With reference to FIG. 29, a second etch process, such as an anisotropic dry etch process, may be performed after the second photolithography process to form a high-level bit line top contact opening 313 in the third insulating film 605. A width of a bottom opening of the high-level bit line top contact opening 313 may be less than a width of a top opening of the high-level bit line top contact opening 313; in other words, a profile of the high-level bit line top contact opening 313 may be tapered from top to bottom. That is to say, sidewalls of the high-level bit line top contact opening 313 may be slanted toward each other. The width of the bottom opening of the high-level bit line top contact opening 313 may be about the same as a width of a top surface of the high-level bit line bottom contact 303. The top surface of the high-level bit line bottom contact 303 may be exposed through the high-level bit line top contact opening 313 and the high-level bit line trench 311. A cleaning process using a reducing agent may be optionally performed to remove the defects on the top surface of the high-level bit line bottom contact 303 formed including tungsten. The reducing agent may be titanium tetrachloride, tantalum tetrachloride, or a combination thereof.

Figure 30:
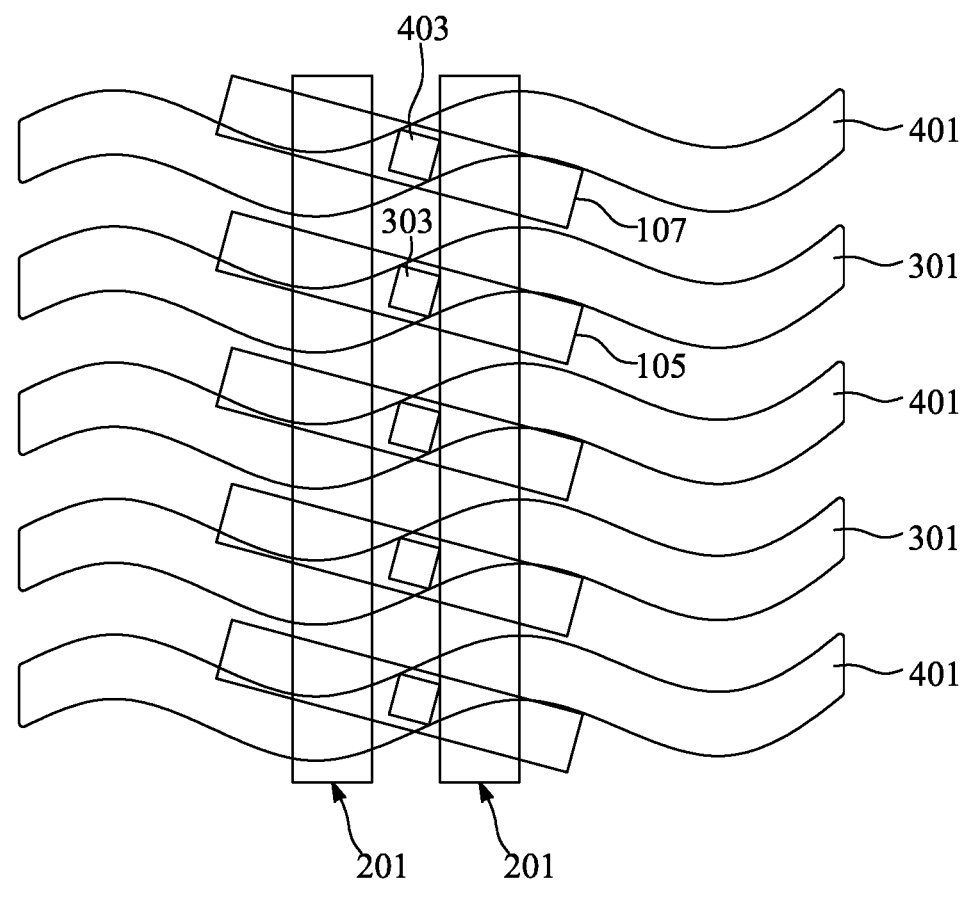
Figure 31:
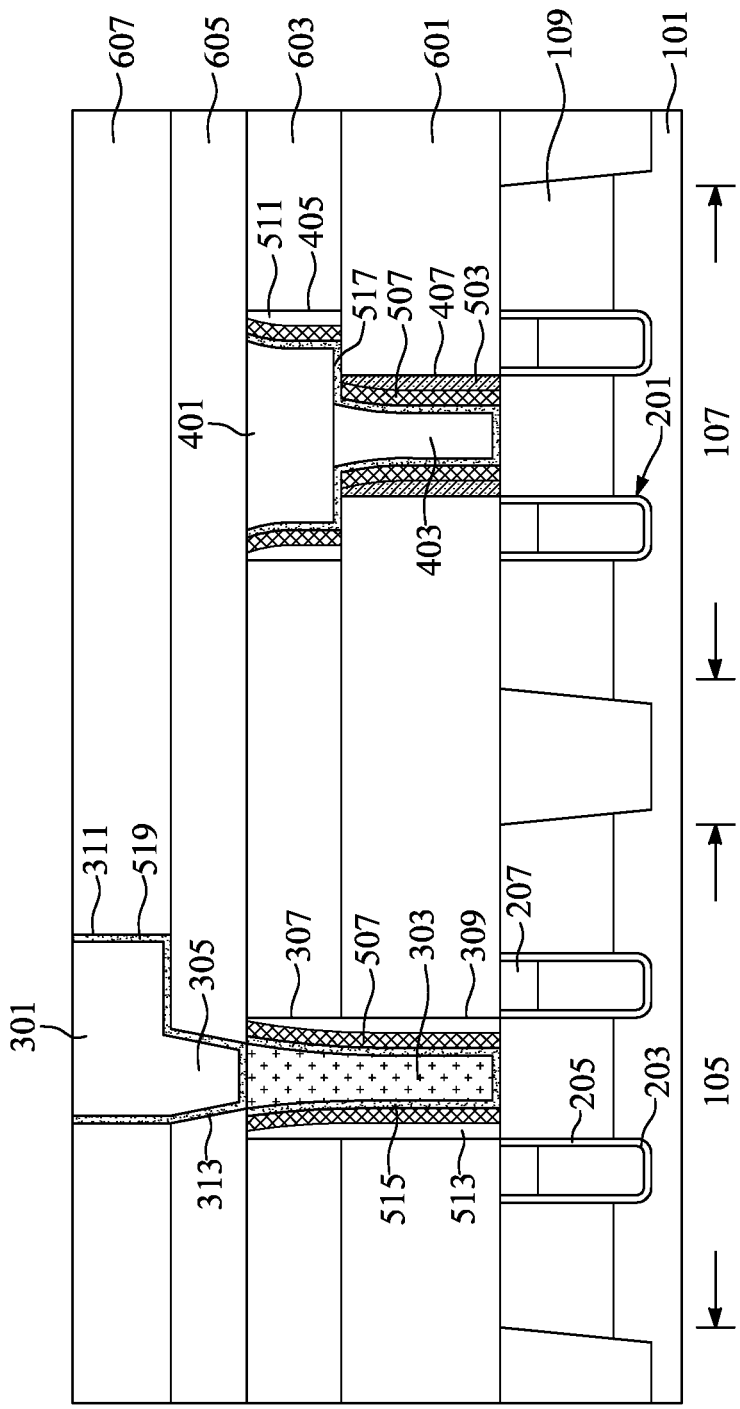

FIG. 30 illustrates, in a schematic top-view diagram, and FIG. 31 illustrates, in a schematic cross-sectional diagram, part of the flow of fabricating the semiconductor device in accordance with one embodiment of the present disclosure. With reference to FIG. 30 and FIG. 31, a conductive material, for example, doped polysilicon, metal, metal nitride, or metal silicide, may be deposited into the high-level bit line trench 311 and the high-level bit line top contact opening 313 by a metallization process. After the metallization process, a planarization process, such as chemical mechanical polishing, may be performed to remove excess filling material, provide a substantially flat surface for subsequent processing steps, and conformally form the high-level bit line 301 and the high-level bit line top contact 305. In addition, a third liner 519 may be formed on and attached to sidewalls of the high-level bit line trench 311, a portion of a bottom of the high-level bit line trench 311, the sidewalls of the high-level bit line top contact opening 313, and the bottom of the high-level bit line top contact opening 313 before forming the high-level bit line 301 and the high-level bit line top contact 305. In some embodiments, the high-level bit line 301 is a wavy conductive line between two adjacent low-level bit lines 401.

Figure 32:
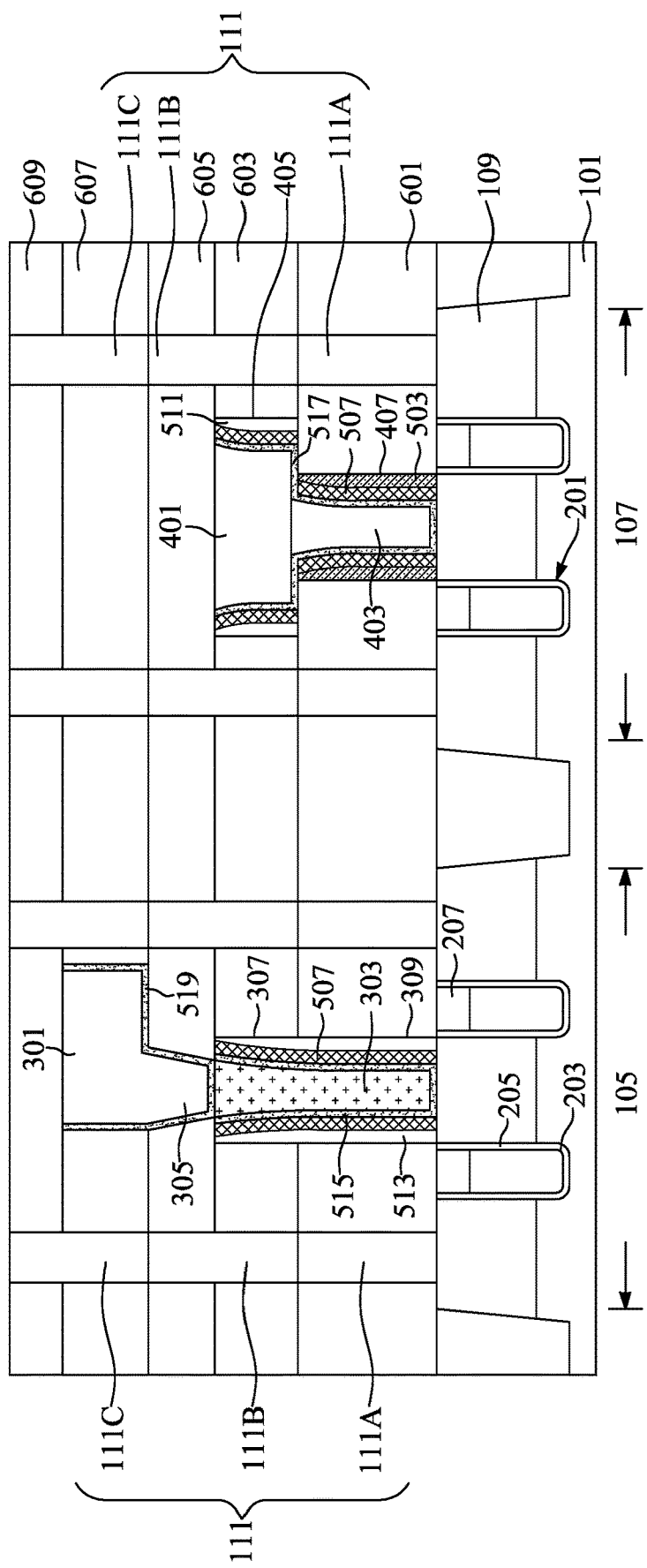

With reference to FIG. 8 and FIG. 32, a plurality of conductive plugs 111 may be formed above the substrate 101. A fifth insulating film 609 may be formed on the fourth insulating film 607. A photolithography process may be performed to define positions of the high-level bit line trench 311 in the fifth insulating film 609. After the photolithography process, an etch process, such as an anisotropic dry etch process, may be performed to form a plurality of conductive plug openings penetrating the fifth insulating film 609, the fourth insulating film 607, the third insulating film 605, the second insulating film 603, and the first insulating film 601. Top surfaces of the plurality of doped regions 109 disposed between the isolation layer 103 and the plurality of word lines 201 in both the first active area 105 and the second active area 107 may be exposed through the plurality of conductive plug openings.

Figure 33:
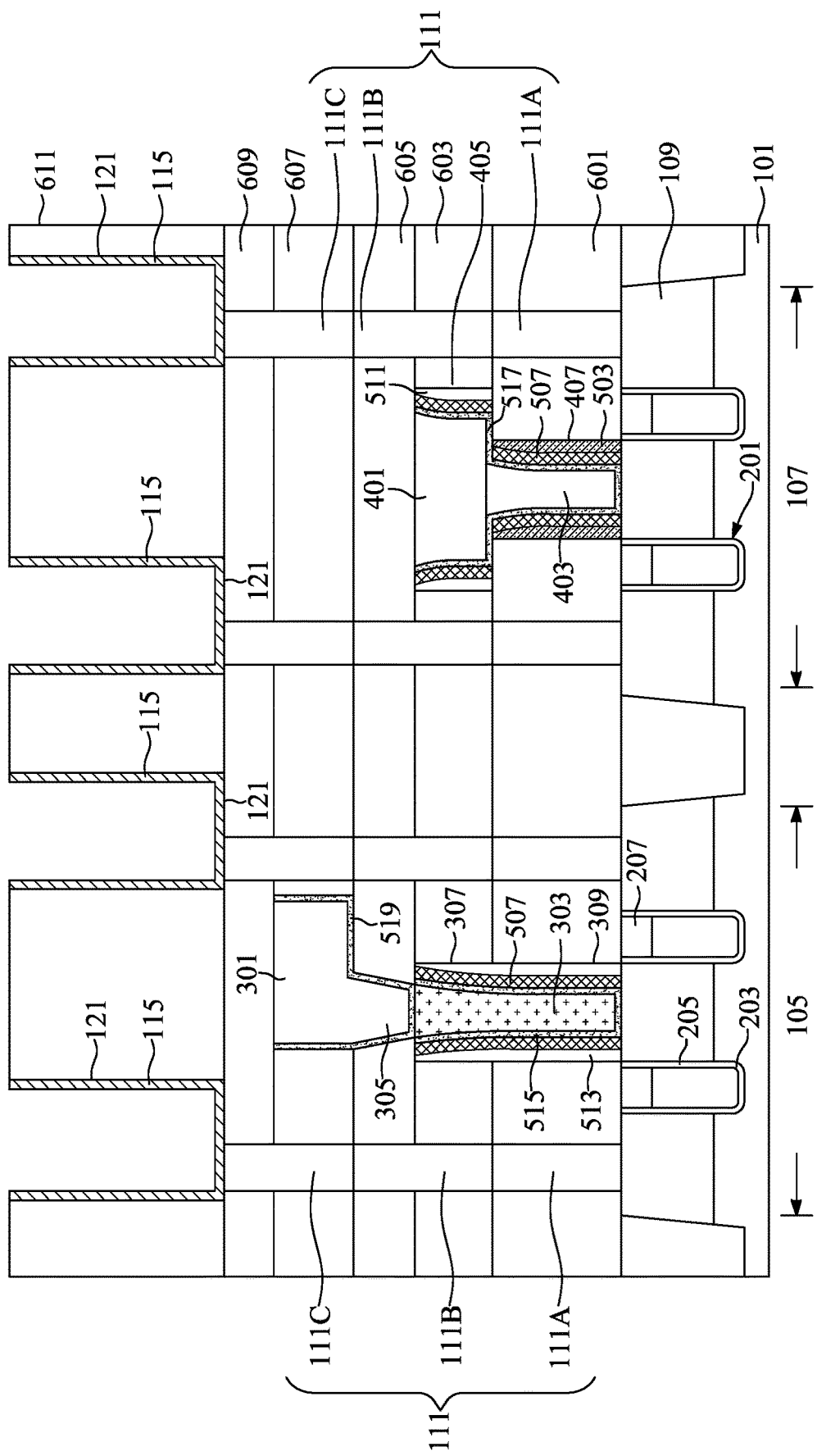

With reference to FIG. 33, a conductive material, for example, doped polysilicon, titanium, titanium nitride, tantalum, tantalum nitride, tungsten, copper, aluminum or aluminum alloy, may be deposited into the plurality of conductive plug openings by a metallization process. After the metallization process, a planarization process, such as chemical mechanical polishing, may be performed to remove excess filling material, provide a substantially flat surface for subsequent processing steps, and conformally form the plurality of conductive plugs 111. The plurality of conductive plugs 111 may be respectively correspondingly electrically connected to the plurality of doped regions 109 disposed between the isolation layer 103 and the plurality of word lines 201 in both the first active area 105 and the second active area 107. In some embodiments, the conductive plug 111 serves as a capacitor contact adjacent to the bit line bottom contact 303, wherein the capacitor contact comprises a doped polysilicon layer 111A, a cobalt silicide layer 111B disposed over the doped polysilicon layer 111A, and a tungsten contact 111C disposed over the cobalt silicide layer 111B.

With reference to FIG. 1, FIG. 8 and FIGS. 33 to 34, a plurality of capacitor structures 113 may be formed above the substrate 101. With reference to FIG. 33, a sixth insulating film 611 may be formed on the fifth insulating film 609. A photolithography process may be performed to define positions of the plurality of capacitor structures 113 in the sixth insulating film 611. After the photolithography process, an etch process, such as an anisotropic dry etch process, may be performed to form a plurality of capacitor trenches 121 in the sixth insulating film 611. Top surfaces of the plurality of conductive plugs 111 may be exposed through the plurality of capacitor trenches 121. A plurality of capacitor bottom electrodes 115 may be respectively correspondingly formed in the plurality of capacitor trenches 121.

Figure 34:
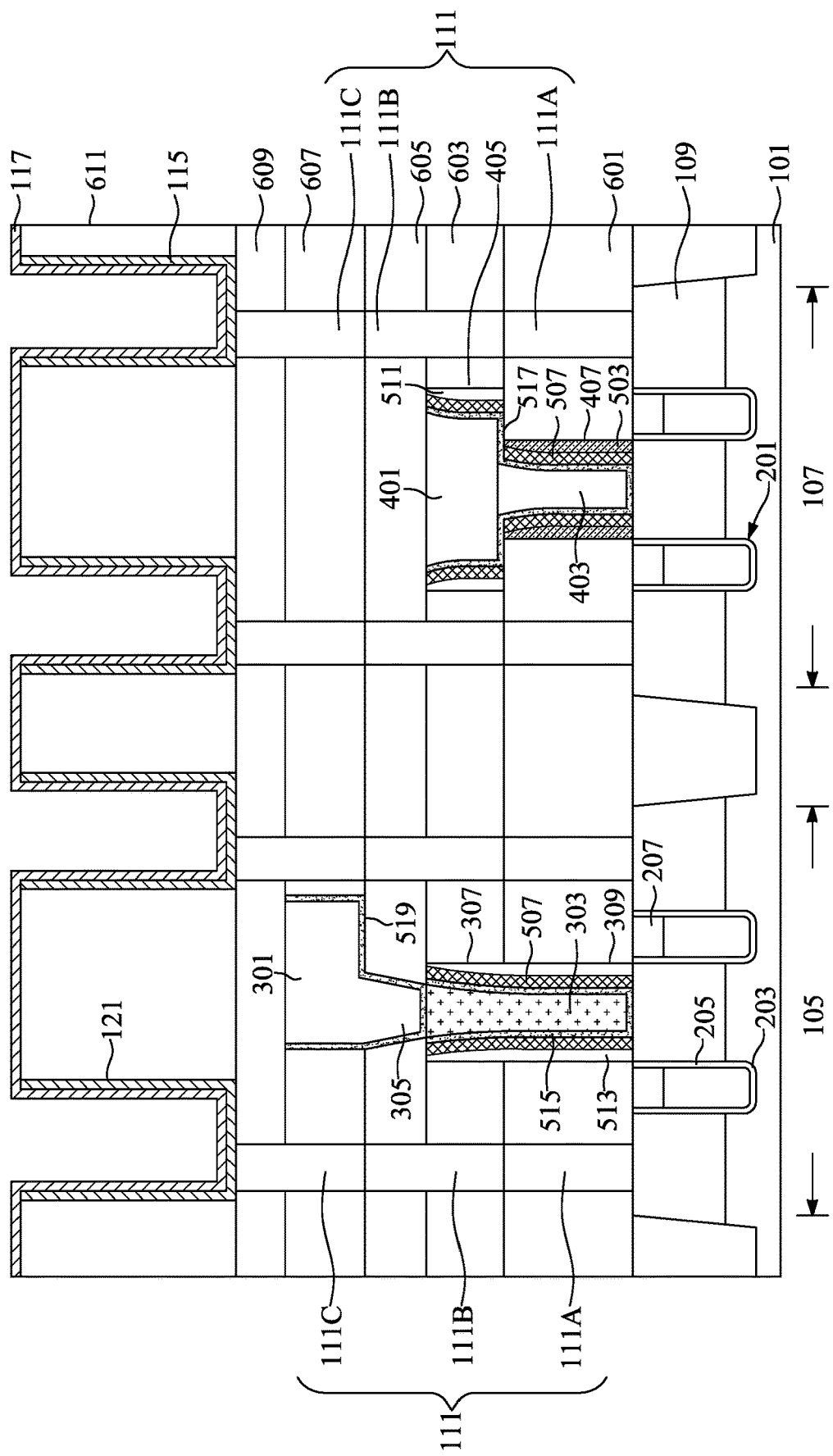

With reference to FIG. 34, a capacitor insulating layer 117 may be formed on the plurality of capacitor bottom electrodes 115 in the plurality of capacitor trenches 121. With reference back to FIG. 1, a capacitor top electrode 119 may be formed on the capacitor insulating layer 117 and may fill the plurality of capacitor trenches 121. The plurality of capacitor bottom electrodes 115, the capacitor insulating layer 117, and the capacitor top electrode 119 together form the plurality of capacitor structures 113.

One aspect of the present disclosure provides a semiconductor device including a substrate; a dielectric structure disposed over the substrate; a bit line bottom contact disposed in the dielectric structure; a composite decoupling structure disposed between the dielectric structure and the bit line bottom contact, wherein the composite decoupling structure comprises an air gap and a dielectric spacer; a bit line top contact disposed over the bit line bottom contact; and a bit line disposed over the bit line top contact.

Another aspect of the present disclosure provides a method for fabricating a semiconductor device including: forming a dielectric structure over a substrate; forming a bit line bottom contact in the dielectric structure; forming a composite decoupling structure between the dielectric structure and the bit line bottom contact, wherein the composite decoupling structure comprises an air gap and a dielectric spacer; forming a bit line top contact over the bit line bottom contact; and forming a bit line over the bit line top contact.

Due to the design of the semiconductor device having a composite decoupling structure having the air gap, the parasitic capacitance of the semiconductor device may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate;
    a dielectric structure disposed over the substrate;
    a bit line bottom contact disposed in the dielectric structure;
    a composite decoupling structure disposed between the dielectric structure and the bit line bottom contact, wherein the composite decoupling structure comprises an air gap and a dielectric spacer;

a bit line top contact disposed over the bit line bottom contact; and a bit line disposed over the bit line top contact;

wherein a width of a bottom of the bit line top contact is less than a width of a top surface of the bit line bottom contact.

2. The semiconductor device of claim 1, further comprising a liner disposed between the bit line bottom contact and the air gaps.

3. The semiconductor device of claim 1, wherein the bit line is asymmetrically disposed over the bit line top contact.

4. The semiconductor device of claim 1, wherein a width of a top surface of the bit line top contact is greater than a width of a bottom of the bit line top contact.

5. The semiconductor device of claim 1, wherein a width of the bit line is greater than a top surface of the bit line top contact.

6. The semiconductor device of claim 1, wherein the air gap is disposed between the dielectric spacer and the dielectric structure.

7. The semiconductor device of claim 1, wherein the air gap has a spacer profile.

8. The semiconductor device of claim 1, further comprising a capacitor contact adjacent to the bit line bottom contact, wherein the capacitor contact comprises a doped polysilicon layer, a cobalt silicide layer disposed over the doped polysilicon layer, and a tungsten contact disposed over the cobalt silicide layer.

9. A method for fabricating a semiconductor device, comprising:

forming a dielectric structure over a substrate;

forming a bit line bottom contact in the dielectric structure;

forming a composite decoupling structure between the dielectric structure and the bit line bottom contact, wherein the composite decoupling structure comprises an air gap and a dielectric spacer;

forming a bit line top contact over the bit line bottom contact; and forming a bit line over the bit line top contact;

wherein a width of a bottom of the bit line top contact is less than a width of a top surface of the bit line bottom contact.

10. The method of claim 9, further comprising: forming a liner between the bit line bottom contact and the air gaps.

11. The method of claim 9, wherein the bit line is asymmetrically disposed over the bit line top contact.

12. The method of claim 9, wherein a width of a top surface of the bit line top contact is greater than a width of a bottom of the bit line top contact.

13. The method of claim 9, wherein a width of the bit line is greater than a top surface of the bit line top contact.

14. The method of claim 9, wherein the air gap is formed between the dielectric spacer and the dielectric structure.

15. The method of claim 9, further comprising: forming a capacitor contact adjacent to the bit line bottom contact, wherein the capacitor contact comprises a doped polysilicon layer, a cobalt silicide layer disposed over the doped polysilicon layer, and a tungsten contact disposed over the cobalt silicide layer.

* * * * *